(12) United States Patent
Oku et al.

(10) Patent No.: US 6,835,669 B2
(45) Date of Patent: Dec. 28, 2004

(54) FILM FORMING METHOD, SEMICONDUCTOR DEVICE AND SEMICONDUCTOR DEVICE MANUFACTURING METHOD

(75) Inventors: Taizo Oku, Tokyo (JP); Junichi Aoki, Tokyo (JP); Youichi Yamamoto, Tokyo (JP); Takashi Koromokawa, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/903,764

(22) Filed: Jul. 13, 2001

(65) Prior Publication Data

US 2002/0028584 A1 Mar. 7, 2002

(30) Foreign Application Priority Data

Jul. 21, 2000 (JP) ........................... 2000-221379
Sep. 18, 2000 (JP) ........................... 2000-281263

(51) Int. Cl.$^7$ ..................... H01L 21/31; H01L 21/469
(52) U.S. Cl. ..................... 438/758; 438/762; 438/778
(58) Field of Search ..................... 438/789, 793, 438/790, 794, 762, 773, 775, 758, 778, 427, 478, 493

(56) References Cited

U.S. PATENT DOCUMENTS

| | | | |
|---|---|---|---|
| 4,282,268 A | | 8/1981 | Priestley et al. ............... 427/39 |
| 5,554,570 A | * | 9/1996 | Maeda et al. ............... 438/763 |
| 5,989,998 A | * | 11/1999 | Sugahara et al. ............ 438/623 |
| 6,133,162 A | | 10/2000 | Suzuki et al. ............... 438/780 |
| 6,642,157 B2 | * | 11/2003 | Shioya et al. ............... 438/789 |
| 2003/0111730 A1 | * | 6/2003 | Takeda et al. ............... 257/758 |

FOREIGN PATENT DOCUMENTS

| | | | | |
|---|---|---|---|---|
| EP | 0 664 560 A2 | | 1/1995 | |
| EP | 0 851 480 B1 | | 7/1997 | |
| EP | 0 881 678 A2 | | 5/1998 | |
| EP | 1 174 914 A2 | | 7/2001 | |
| EP | 1 174 916 A2 | | 7/2001 | |
| EP | 1 174 915 A2 | * | 1/2002 | ......... H01L/21/316 |
| JP | 08-236518 | * | 9/1996 | ......... H01L/21/316 |
| JP | 09-134910 | * | 5/1997 | |
| JP | 10-125669 | * | 5/1998 | |
| JP | 10-163195 | | 6/1998 | |
| JP | 10-189577 | | 7/1998 | |
| JP | 11-288931 | | 10/1999 | |
| KR | 2002-0009429 | | 2/2002 | |
| WO | 98/50945 | | 7/1997 | |

OTHER PUBLICATIONS

Vestiel et al, "A Low Dielectric Film Obtained by Polymerization of . . . "; 30th European Microwave Conf. Proceed., Paris, Oct. 3–5, 2000, vol., 3 of 3, Conf. 30, Oct. 5, 2000 pp. 233–236.

Bogart et al, "Deposition of SIO2 Films from Novel Alkoxysilane/O2 Plasmas", Jornal of Vacuum Science and Technology, Part A, American Institute of Physics. vol. 16, No. 6, Nov. 1998, pp. 3175–3184.

* cited by examiner

*Primary Examiner*—W. David Coleman
*Assistant Examiner*—Khiem D Nguyen
(74) *Attorney, Agent, or Firm*—Lorusso, Loud & Kelly

(57) ABSTRACT

The present invention relates to a film forming method of forming an interlayer insulating film having a low dielectric constant for covering wiring. The insulating film covering wiring is formed on a substrate by converting into a plasma and reacting a film forming gas including a component selected from the group consisting of alkoxy compounds having Si—H bonds and siloxanes having Si—H bonds and an oxygen-containing gas selected from a group consisting of $O_2$, $N_2O$, $NO_2$, $CO$, $CO_2$, and $H_2O$.

7 Claims, 18 Drawing Sheets

FIG. 3A

Film Density Measured by the X-Ray Interference Method

| Examined Film Type | PE-CVD TMS SiO₂ Film | PE-CVD TEOS SiO₂ Film | PE-CVD SiH₄ SiO₂ Film | Thermal SiO₂ Film |
|---|---|---|---|---|
| Film Density (g/cm³) | 2.33 | 2.26 | 2.24~2.30 | 2.23 |

FIG. 3B

Film Density Measured by the Weight Measurement

| Examined Film Type | PE-CVD TMS SiO₂ Film | PE-CVD TEOS SiO₂ Film | PE-CVD SiH₄ SiO₂ Film |
|---|---|---|---|
| Film Density (g/cm³) | 2.33 | 2.1~2.2 | 2.20 |

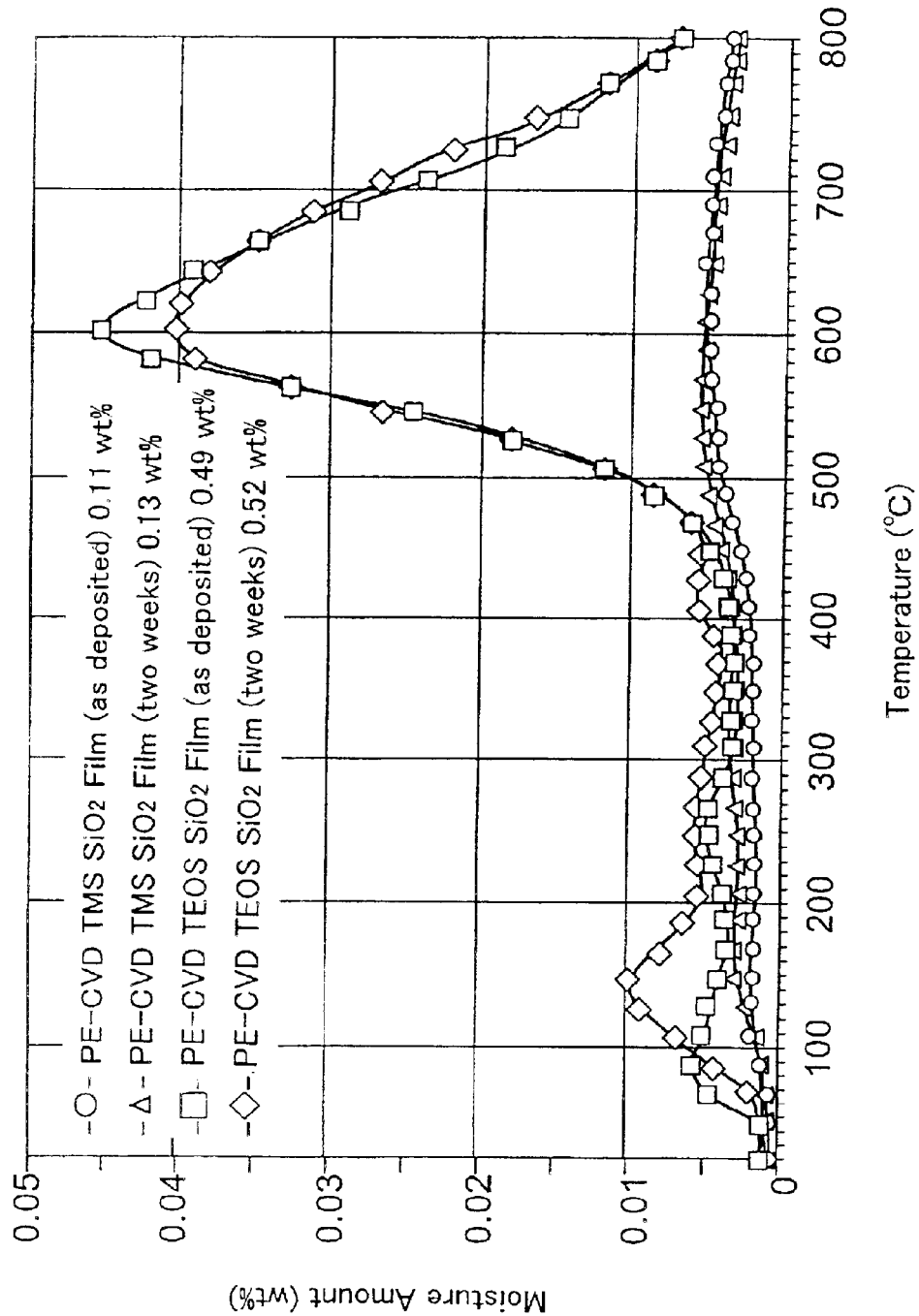

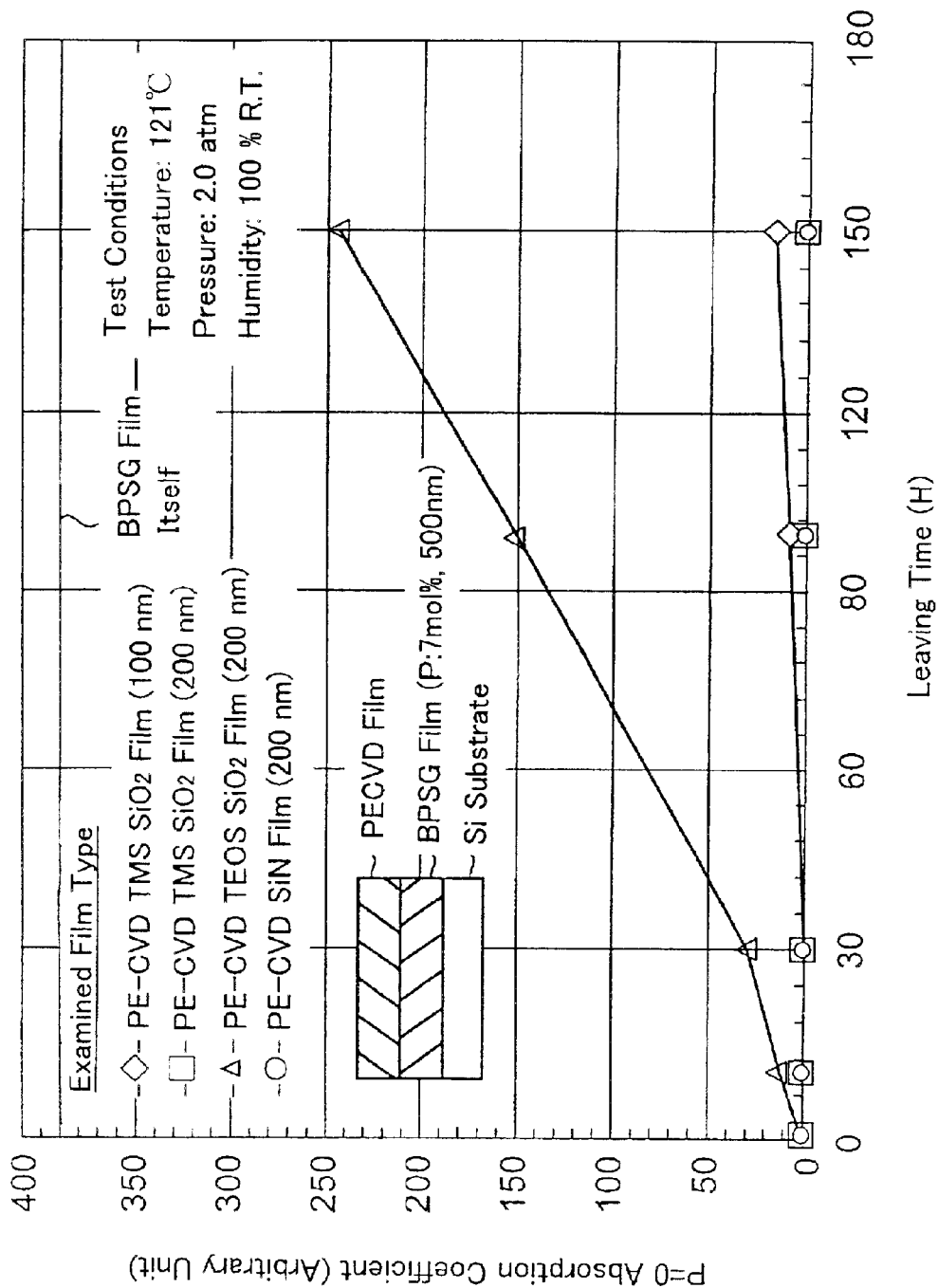

FIG. 8

| Underlying Low Dielectric Constant Insulating Film Type | | Examined Film Type | |
|---|---|---|---|
| | Surface Treatment | PE-CVD TMS SiO$_2$ Film | PE-CVD TEOS SiO$_2$ Film |
| Inorganic Coating Insulating Film k=2.9 | Applied | ◯ | △ |
| | Not Applied | ◯ | × |
| Organic Coating Insulating Film k=2.8 | Applied | ◯ | △ |
| | Not Applied | ◯ | × |

FILM FORMING METHOD, SEMICONDUCTOR DEVICE AND SEMICONDUCTOR DEVICE MANUFACTURING METHOD

BACKGROUND OF THE INVENTION

1. Field of the Invention

The present invention relates to a film forming method, a semiconductor device and a semiconductor device manufacturing method and, more particularly, a film forming method, a semiconductor device and a semiconductor device manufacturing method for covering wiring with an interlayer insulating film having a low dielectric constant.

2. Description of the Prior Art

In recent years, miniaturization and reduction in thickness of the pattern have been required for a higher degree of integration and higher density of semiconductor integrated circuit devices, as well as for higher speed of data transfer.

Therefore, an insulating film having a low dielectric constant (referred to as a "low dielectric constant insulating film" hereinafter) and small RC delay is employed. Such insulating films include SiOF films having a relative dielectric constant of 3.5 to 3.8, porous $SiO_2$ films having a relative dielectric constant 3.0 to 3.1, etc., for example.

However, such a low dielectric constant insulating film takes up and passes moisture. Therefore, if such a low dielectric constant insulating film is employed alone as the interlayer insulating film, corrosion of the wiring and increase in the leakage current easily result. In order to prevent same, a barrier insulating film containing Si and N or Si and C is often interposed between the wiring and the low dielectric constant insulating film.

More particularly, in a semiconductor device having multi-layered wiring, an interlayer insulating film including barrier layers is formed between the upper wiring and the lower wiring. The interlayer insulating film containing barrier layers is formed by laminating a barrier insulating film containing Si and N or Si and C, a low dielectric constant insulating film, and a barrier insulating film containing Si and N or Si and C, in sequence.

However, the insulating film containing Si and N has a high relative dielectric constant. Therefore, even if such an insulating film is made thinner and employed as the barrier insulating film, the dielectric constant of the overall interlayer insulating film is increased.

Also, the relative dielectric constant of the barrier insulating film containing Si and C is relatively low, i.e., about 5, as compared to a barrier insulating film containing Si and N. But such a barrier insulating film containing Si and C cannot sufficiently suppress leakage current.

SUMMARY OF THE INVENTION

It is an object of the present invention to lower the dielectric constant of an interlayer insulating film as a whole and to suppress change in the dielectric constant due to moisture absorption, while preventing corrosion of wiring and an increase in leakage current.

In the film forming method according to the present invention, the silicon-containing insulating film is formed by converting to a plasma a film forming gas selected from the group consisting of alkoxy compounds having Si—H bonds and siloxane compounds having Si—H bonds and an oxygen-containing gas selected from the group consisting of $O_2$, $N_2O$, $NO_2$, $CO$, $CO_2$, and $H_2O$, and reacting the plasma components. It has been found that the resulting silicon-containing insulating film is dense, has high moisture resistance, has a low moisture content, and has a small relative dielectric constant.

Therefore, if the above silicon containing insulating film is employed as the barrier insulating films (a lower protection layer and an upper protection layer) that constitute the interlayer insulating film interposed between the upper wiring and the lower wiring, and sandwich the low dielectric constant insulating film, the dielectric constant of the overall interlayer insulating film can be lowered while preventing corrosion of the wiring and increase in the leakage current.

The semiconductor device of the present invention includes a silicon-containing insulating film whose peak infrared ray absorption intensity is in a range of wave number of 2270 to 2350 $cm^{-1}$, whose film density is in a range of 2.25 to 2.40 $g/cm^3$, and whose relative dielectric constant is in a range of 3.3 to 4.3, formed on a substrate.

It has been experimentally found that the silicon-containing insulating film having such characteristics has high mechanical strength, is dense, is excellent in water resistance, and has a low amount of contained moisture, like the silicon nitride film, and has a relative dielectric constant smaller than that of a silicon nitride film.

In the manufacture of a semiconductor device, the above silicon-containing insulating film is formed to contact and cover the wiring or is formed as a protection layer on an insulating film that covers the wiring.

The silicon-containing insulating film of the present invention has a low dielectric constant, contains a low amount of moisture, is dense, and has excellent water resistance. Therefore, if a silicon-containing insulating film is employed as a protection layer covering the wiring, etc., corrosion of the wiring can be prevented by preventing moisture from entering the semiconductor device while reducing the parasitic capacitance between the wirings.

The upper and lower wirings and the interlayer insulating film interposed between the upper and lower wirings are provided on a substrate, and the interlayer insulating film is formed of the silicon-containing insulating film according to the present invention.

The interlayer insulating film includes, in order from the bottom, a lower protection layer formed of the silicon-containing insulating film according to the present invention, the main insulating film, and an upper protection layer formed of the silicon-containing insulating film according to the present invention.

If the main insulating film is a SiOF film, the silicon-containing insulating film according to the present invention can prevent the fluorine (F) from diffusing to the outer peripheral portions 5 of the silicon-containing insulating film. If the main insulating film is a porous insulating film having high hygroscopicity, the silicon-containing insulating film according to the present invention can prevent the ingress of moisture into the porous insulating film and thus prevent increase in the dielectric constant due to moisture absorption.

Also, since a silicon nitride film is not employed as the upper and lower protection layers for the main insulating film, and the silicon-containing insulating film having a low relative dielectric constant is employed instead, the dielectric constant of the overall interlayer insulating film can be reduced,

BRIEF DESCRIPTION OF THE DRAWINGS

FIG. 3A and FIG. 3B are tables showing film density of the insulating film that is formed by the film forming method according to a second embodiment of the present invention using the sample of FIG. 2A;

FIG. 4 is a graph of moisture content and water resistance of the silicon-containing insulating film that is formed by the film forming method according to the second embodiment of the present invention using the sample of FIG. 2A;

FIG. 6 is a graph of water resistance of the silicon-containing insulating film that is formed by the film forming method according to the second embodiment of the present invention using the sample of FIG. 2B;

FIG. 8 is a table showing adhesiveness to a coated insulating film for the silicon-containing insulating film that is formed by the film forming method according to the second embodiment of the present invention, using the sample of FIG. 2C;

DESCRIPTION OF THE PREFERRED EMBODIMENTS

Embodiments of the present invention will now be described with reference to the accompanying drawings hereinafter.

First Embodiment

Figure 1:
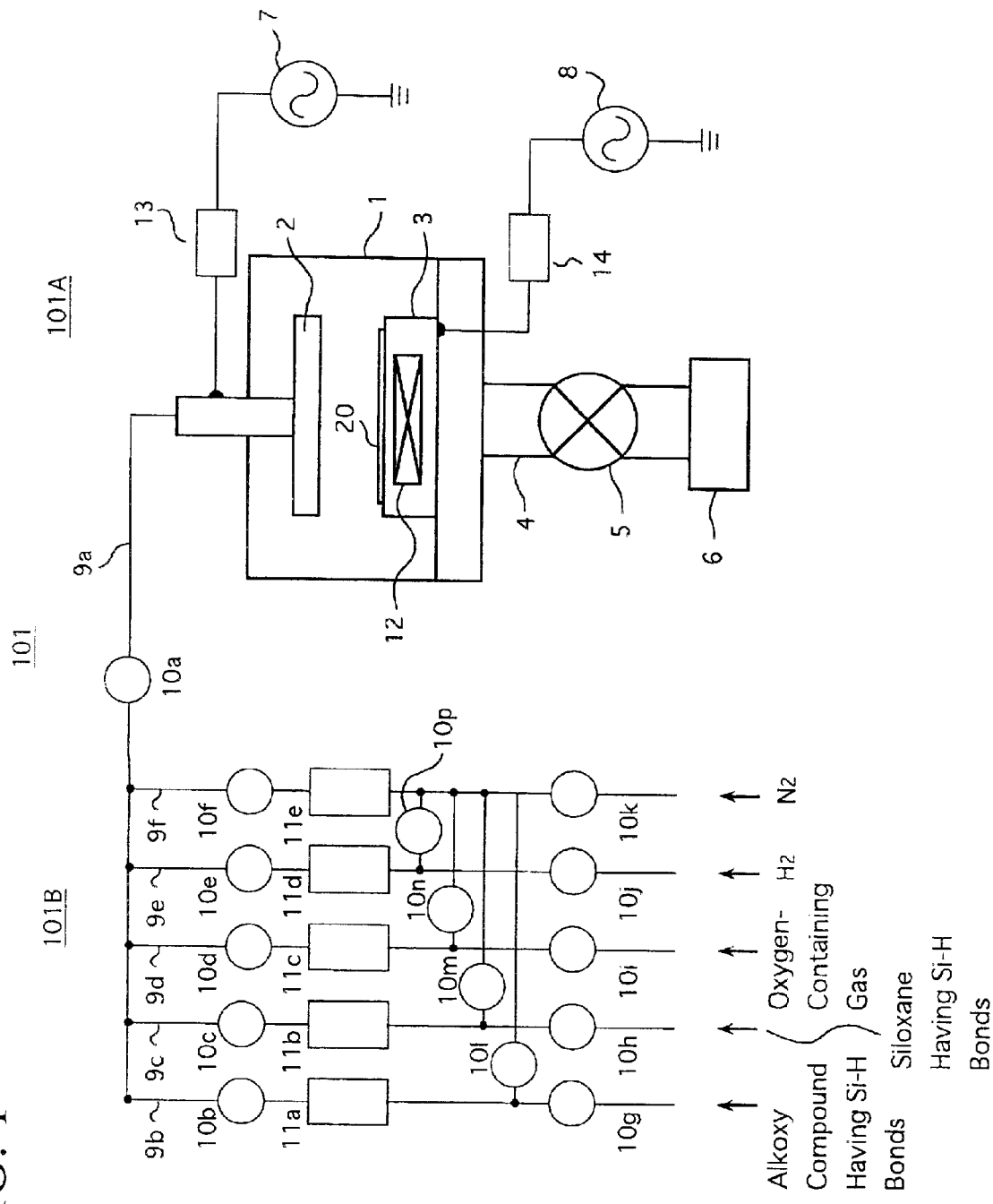
FIG. 1 is a side view of the plasma CVD film forming equipment employed in the film forming method according to a first embodiment of the present invention.

FIG. 1 shows CVD film forming equipment 101 as including a film forming portion 101A wherein a silicon-containing insulating film is formed from a plasma on a substrate 20, and a film forming gas supplying portion 101B having a plurality of gas supply sources for the film forming gas.

As shown in FIG. 1, the film forming portion 101A has a chamber wherein pressure can be reduced, and which is connected to an exhaust device 6 via an exhaust pipe 4. A switching valve 5 for controlling opening and closing communication between the chamber 1 and the exhaust device 6 is provided in the middle of the exhaust pipe 4. A pressure measuring means such as a vacuum gauge (not shown) for monitoring the pressure in the chamber 1 is provided in the chamber 1.

An upper electrode (first electrode) 2 and a lower electrode (second electrode) 3 are provided opposing each other in the chamber 1. A high frequency power supply (RF power supply) 7 for supplying high frequency power at a frequency of 13.56 MHz is connected to the upper electrode 2, while a low frequency power supply 8 for supplying a low frequency power at a frequency of 380 kHz is connected to the lower electrode 3. The film forming gas is converted into a plasma by supplying the power to the upper electrode 2 and the lower electrode 3 from these power supplies 7, 8. The upper electrode 2, the lower electrode 3, and the power supplies 7, 8 constitute the plasma generating means for converting the film forming gas into a plasma.

The plasma generating means may consist of the first and second electrodes 2, 3 of the parallel-plate type, Electron Cyclotron Resonance apparatus, means for generating a helicon plasma by irradiation with high frequency power from an antenna, etc.

The upper electrode 2 is also used as a film forming gas distributor. A plurality of through holes are formed in the upper electrode 2, and the through holes in the surface opposing the lower electrode 3 serve as discharge ports for the film forming gas. The discharge ports of the film forming gas, etc. are connected to the film forming gas supplying portion 101B via a pipe 9a. Also, a heater (not shown) may be provided in the upper electrode 2. If the upper electrode 2 is heated at a temperature of almost 100° C. during the film formation, particles of reaction products, etc., can be prevented from sticking onto the upper electrode 2.

The lower electrode 3 is also used as a loading table for the substrate 20. A heater 12 for heating the substrate 20 on the loading table is provided in the lower electrode 3.

In the film forming gas supplying portion 101B, a supply source for the alkoxy compound having Si—H bonds; a supply source for the siloxane having Si—H bonds; a supply source for an oxygen-containing gas selected from the group consisting of oxygen ($O_2$), nitrogen monoxide ($N_2O$), nitrogen dioxide ($NO_2$), carbon monoxide (CO), carbon dioxide ($CO_2$), and water ($H_2O$); a supply source for the hydrogen ($H_2$); and a supply source for the nitrogen ($N_2$) are provided.

As for the alkoxy compound having Si—H bonds or the siloxane having Si—H bonds as the film forming gas to which the present invention is applied, the following are typical examples.

(i) alkoxy compound having Si—H bonds
trimethoxysilane (TMS: SiH(OCH$_3$)$_3$)

(ii) siloxane having Si—H bonds
tetramethyldisiloxane (TMDSO: (CH$_3$)$_2$HSi—O—SiH(CH$_3$)$_2$)

These gases are supplied appropriately to the chamber 1 of the film forming portion 101A via branch I pipes 9b to 9f and a pipe 9a to which all branch pipes 9b to 9f are connected. Flow rate controlling means 11a to 11e and switching means 10b to 10k for controlling the opening and the closing of the branch pipes 9b to 9f are provided in the middle of each of the branch pipes 9b to 9f. A switching means 10a for controlling the opening and the closing of the pipe 9a is provided in the middle of the pipe 9a. Also, in order to purge the residual gas from the branch pipes 9b to 9e with $N_2$ gas, switching means 10l to 10n, 10p are provided for controlling the opening and closing of communication between the branch pipe 9f, that is connected to the $N_2$ gas supply source, and remaining branch pipes 9b to 9e. The $N_2$ gas purges the residual gas from the pipe 9a and the chamber 1 in addition to the branch pipes 9b to 9e.

Thus, the film forming equipment 101 includes the supply source for supplying at least one alkoxy compound having Si—H bonds or siloxane having Si—H bonds and the oxygen-containing gas supply source, and also the plasma generating means 2, 3, 7, 8 for plasmanizing the film forming gas.

The insulating film containing Si, O, C, H can be formed by the plasma CVD method by using the above plasma CVD equipment. Therefore, as shown in a second embodiment described in the following, it is possible to form an insulating film that has a low dielectric constant, has a low moisture content, is dense and has excellent water resistance. Also, this insulating film has good adhesiveness to an organic coating insulating film or to an inorganic coating insulating film, and is more effective in preventing the diffusion of copper (Cu).

In particular, the power supplies 7, 8 for supplying power at high and low frequencies, respectively, are connected to the first and second electrodes 2, 3. Therefore, the plasma can be generated by applying the power at high and low frequencies to the electrodes 2, 3 respectively.

Second Embodiment

Again, conventional parallel-plate type plasma CVD equipment is employed as the plasma CVD equipment. The lower electrode 3 is also used as a substrate holder, and the heater 12 for heating the substrate is built into the lower electrode 3.

Formation of Samples

FIGS. 2A to 2E are sectional views showing samples having the silicon oxide film (a silicon-containing insulating film) of the present embodiment.

Figure 2A:
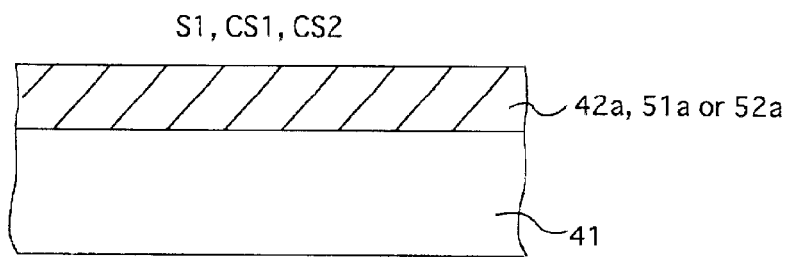
FIG. 2A to FIG. 2E are sectional views showing structures of samples examined to determine characteristics of a silicon-containing insulating film that is formed by the film forming method according to the first embodiment of the present invention, and structures of comparative samples.

As shown in FIG. 2A, a sample S1 has a silicon oxide film (this means a silicon-containing insulating film, and referred to as a "PE-CVD TMS $SiO_2$ film" hereinafter) 42a, formed by the PE-CVD method using a film 'forming gas containing trimethoxysilane (TMS), on a silicon substrate 41. For the sake of comparison, a comparative sample CS1 had a silicon oxide film (referred to as a "PE-CVD TEOS $SiO_2$ film" hereinafter) 51a formed by the PE-CVD method using a film forming gas containing tetraethoxysilane (TEOS) on the silicon substrate 41, and a comparative sample CS2 had a silicon oxide film (referred to as a "PE-CVD SiH4 $SiO_2$ film" hereinafter) 52a is formed by the PE-CVD method using the film forming gas containing monosilane ($SiH_4$) on the silicon substrate 41.

Figure 2B:
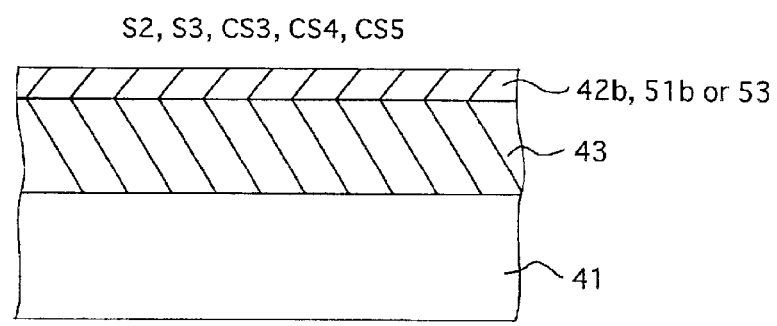
Figure 2C:
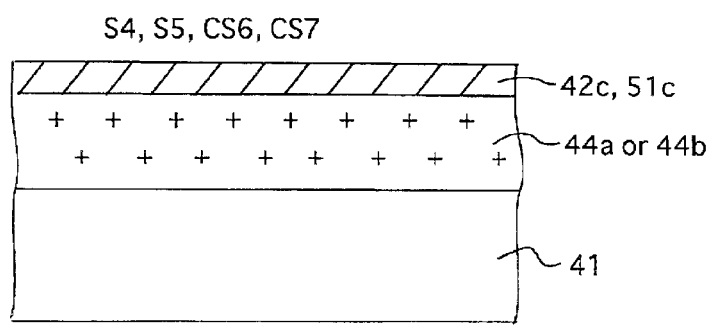
Figure 2D:
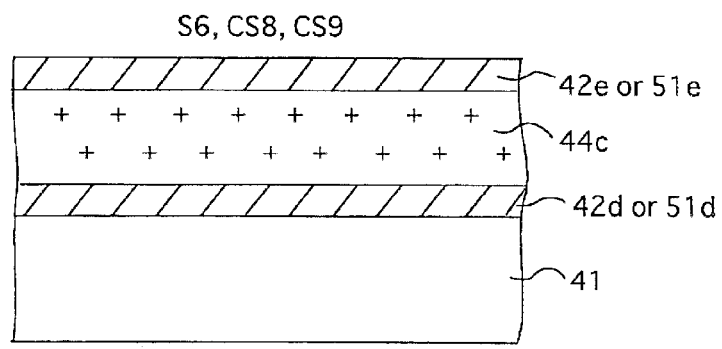
Figure 2E:
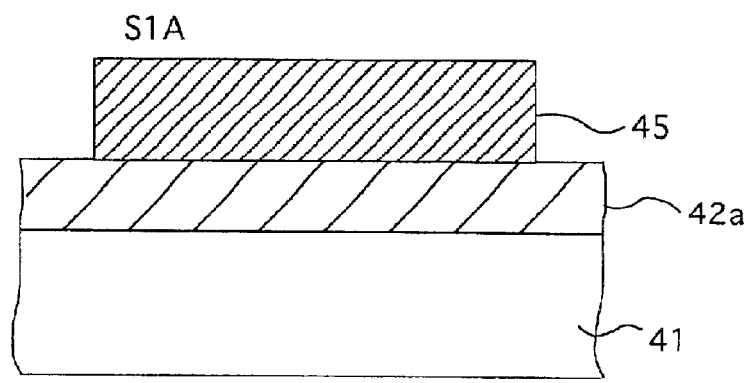

As shown in FIG. 2E, a sample S1A was formed by further forming an electrode 45 on the PE-CVD TMS $SiO_2$ film 42a of sample S1 in which the PE-CVD TMS $SiO_2$ film 42a is formed on the silicon substrate 41. A mercury probe is employed as the electrode 45, and the contact area between the mercury probe and the PE-CVD TMS $SiO_2$ film 42a was 0.0230 $cm^2$.

As shown in FIG. 2B, samples S2, S3 were formed of a BPSG film 43 containing 7 mol % phosphorus and having a thickness of about 500 nm and a PE-CVD TMS $SiO_2$ film 42b, in sequence, on the silicon substrate (Si substrate) 41. The thickness of the PE-CVD TMS $SiO_2$ film 42b was 100 nm in the sample S2, and the thickness of the PE-CVD TMS $SiO_2$ film 42b was 200 nm in the sample S3. For comparison, a comparative sample CS3 employed a PE-CVD TEOS $SiO_2$ film 51b having a film thickness of 200 nm in place of the PE-CVD TMS $SiO_2$ film 42b, a comparative sample CS4 employed a PE-CVD $SiH_4$ $SiO_2$ film 52b having a film thickness of 200 nm, and a comparative sample CS5 employed a silicon nitride film (referred to as a "PE-CVD SiN film" hereinafter) 53, that was formed by the plasma CVD method using the film forming gas containing $SiH_4$, $NH_3$ and $N_2$ and had a thickness of 200 nm.

As shown in FIG. 2C, samples S4, S5 had low dielectric constant insulating films 44a, 44b and a PE-CVD TMS $SiO_2$ film 42c formed in sequence on the silicon substrate (Si substrate) 41. An inorganic coating insulating film 44a was employed as the low dielectric constant insulating film in the sample S4, and an organic coating insulating film 44b was employed similarly in the sample S5. For comparison, comparative samples CS6, CS7 employed a PE-CVD TEOS $SiO_2$ film 51c in place of the PE-CVD TMS $SiO_2$ film 42c. The inorganic coating insulating film 44a was employed as the low dielectric constant insulating film in the comparative sample CS6, and the organic coating insulating film 44b was employed similarly in the comparative sample CS7.

The inorganic coating insulating film was formed by coating a liquid such as HSQ (product name: manufactured by Dow Corning Co., Ltd.), MSQ (product name), R7 (product name: Hitachi Chemical Co., Ltd.), etc. In the foregoing, a compound having one carbon or less was used in the coating liquid. The organic coating insulating film was formed from a coating of liquid such as FLARE (product name: manufactured by Allied Signal Co., Ltd.), SiLK (product name: manufactured by The Dow Chemical Co.), etc., in which a compound having two carbons or more is contained in the coating liquid.

As shown in FIG. 2D, a sample S6 was formed of, in sequence, a PE-CVD TMS $SiO_2$ film (lower protection layer) 42d having a film thickness of about 150 nm, a coating insulating film (main insulating film) 44c having a film thickness of about 200 nm, and a PE-CVD TMS $SiO_2$ film (upper protection layer) 42e having a film thickness of about 200 nm on the silicon substrate 41. The coating insulating film 44c was formed by spin-coating the coating liquid (FOx (product name)) that is produced by dissolving HSQ (Hydrogen silsesquioxane) in the solvent, then baking the coated liquid at the temperatures of 150, 200, and 350° C. for one minute in nitrogen, respectively, and then curing at the temperature of 400° C. for 50 minutes in nitrogen. A comparative sample CS8 had a PE-CVD TEOS $SiO_2$ film 51d formed in place of the PE-CVD TMS $SiO_2$ film 42d as the lower protection layer and a comparative sample CS9 had PE-CVD TEOS $SiO_2$ films 51d, 51e formed in place of the PE-CVD TMS $SiO_2$ films 42d, 42e as the upper and lower protection layers.

The PE-CVD TMS $SiO_2$ films 42a to 42e of the samples S1 to S6 were formed by using the above-described plasma CVD apparatus under following film forming conditions.

Film forming gas: TMS+$N_2O$

TMS gas flow rate: 100 sccm $N_2O$ gas flow rate: 3000 sccm

Gas pressure: 0.7 Torr

Plasmanizing conditions

Power density applied to the upper electrode 2: 0.3 W/$cm^2$ (frequency 13.56 MHz)

Power density applied to the lower electrode 3: 0.3 W/$cm^2$ (frequency 380 kHz)

In this film-forming apparatus, these power densities correspond to 750 W applied to the electrodes, respectively.

Substrate temperature: 300 to 400° C.

Film forming thickness: t nm

The above plasma CVD apparatus 101 was also employed for forming the PE-CVD TEOS SiO$_2$ film 51a of the comparative sample CS1, the PE-CVD SiH$_4$ SiO$_2$ film 52a of the comparative sample CS2, the PE-CVD TEOS SiO$_2$ films 51b to 51e of the comparative samples CS3, CS4, CS6 to CS9, and the PE-CVD SiN film 53 of the comparative sample CS5.

Following characteristics of the PE-CVD TMS SiO$_2$ films 42a to 42e formed as above were examined.

(i) Basic Characteristic

The film forming rate of the above film forming conditions was in the range of about 160 to 170 nm/min.

Also, the refractive index of the formed PE-CVD TMS SiO$_2$ film was in the range of 1.477 to 1.48, and the film stress was −250 Mpa or 3.0×109 dyne/cm$^2$. An ellipsometer using a He—Ne laser having a wavelength of 6338 angstroms was employed to measure the refractive index. Also, the optilever laser scanning system was employed to measure the film stress.

Also, the film thickness (t) was 500 nm, and the relative dielectric constant of the PE-CVD TMS SiO$_2$ film was 3.9. The sample C1A was employed as a sample to examine the relative dielectric constant.

The relative dielectric constant was determined by superposing a small signal having a frequency of 1 MHz onto the DC voltage (V) applied between the Si substrate 41 and the electrode 45 in the examined sample S1A, and then measuring the change in capacitance (C) in response to the change in the DC voltage (V).

(ii) Concentration of Carbon and Nitrogen in the Film

Concentration of carbon and nitrogen in the PE-CVD TMS SiO$_2$ film 42a was measured by the auger electron spectroscopy method (AES method) using the sample S1.

According to the results, the concentration of carbon was 1.0 atomic %, and the concentration of carbon is 2.1 atomic %.

(iii) Film Density

The film density of the PE-CVD TMS SiO$_2$ film 42a was examined employing the sample S1 by the well-known X-ray interference method or weight measuring method.

By way of comparison, similar examinations are carried out for the thermal SiO$_2$ film, the comparative sample CS1 of the PE-CVD TEOS SiO$_2$ film 51a, and the comparative sample CS2 of the PE-CVD SiH$_4$ SiO$_2$ film 52a in place of the PE-CVD TMS SiO$_2$ film 42a.

As shown in FIGS. 3A and 3B, it was found that the PE-CVD TMS SiO$_2$ film 42a has a film density of 2.33, higher than other insulating films, and was dense.

(iv) Amount of Moisture Contained in the Film

The amount of moisture contained in both the film that is obtained immediately after formation (as deposited) and the film that is left for two weeks in air was measured employing the sample S1 by the TDS (Thermal-Desorption Mass Spectroscopy) method. This TDS method heats the sample and then measures the molecules emitted from the sample. For the sake of comparison, a similar examination was carried out for the comparative sample CS1 employing the PE-CVD TEOS SiO$_2$ film 51a.

Examination was also carried out with heating of the sample from room temperature to 800° C. using TDS analysis equipment and then quantifying the amount of moisture extracted from the sample.

FIG. 4 is a graph showing the results. In FIG. 4, the ordinate denotes the amount of moisture (wt %) represented on a linear scale and the abscissa denotes the temperature (° C.) represented on a linear scale.

According to the measurement executed immediately after film formation (as deposited), when the temperature is raised from room temperature to 800° C., the amount of moisture in the PE-CVD TMS SiO$_2$ film 42a was 0.11 wt %, whereas the amount of moisture in the PE-CVD TEOS SiO$_2$ film 51a was 0.49 wt %. In addition, according to the measurement executed two weeks later, the amount of moisture in the PE-CVD TMS SiO$_2$ film 42a increased merely by +0.2 to 0.3 wt % and thus the amount of moisture seldom varied.

As described above, it is found that both the structural water (the moisture contained in the film due to the film forming gas and the film structure immediately after the film formation) and the water physically adsorbed in the PE-CVD TMS SiO$_2$ film 42a were small in contrast to the PE-CVD TEOS SiO$_2$ film 51a.

(v) FT-IR Absorption Intensity

Figure 5A:
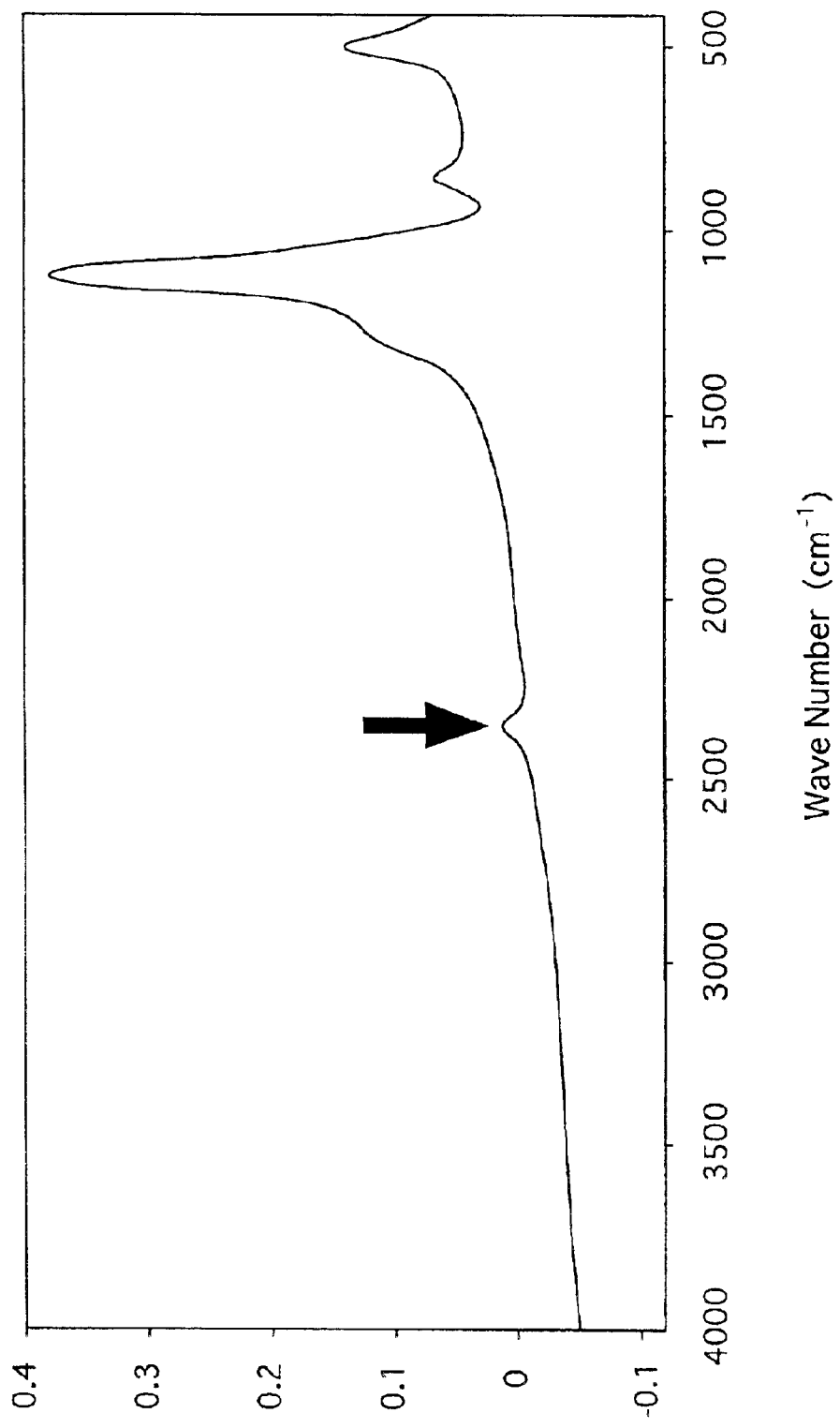
FIG. 5A is a graph of infrared absorption intensity of the silicon-containing insulating film that is formed by the film forming method according to the second embodiment of the present invention using the sample of FIG. 2A.
Figure 5B:
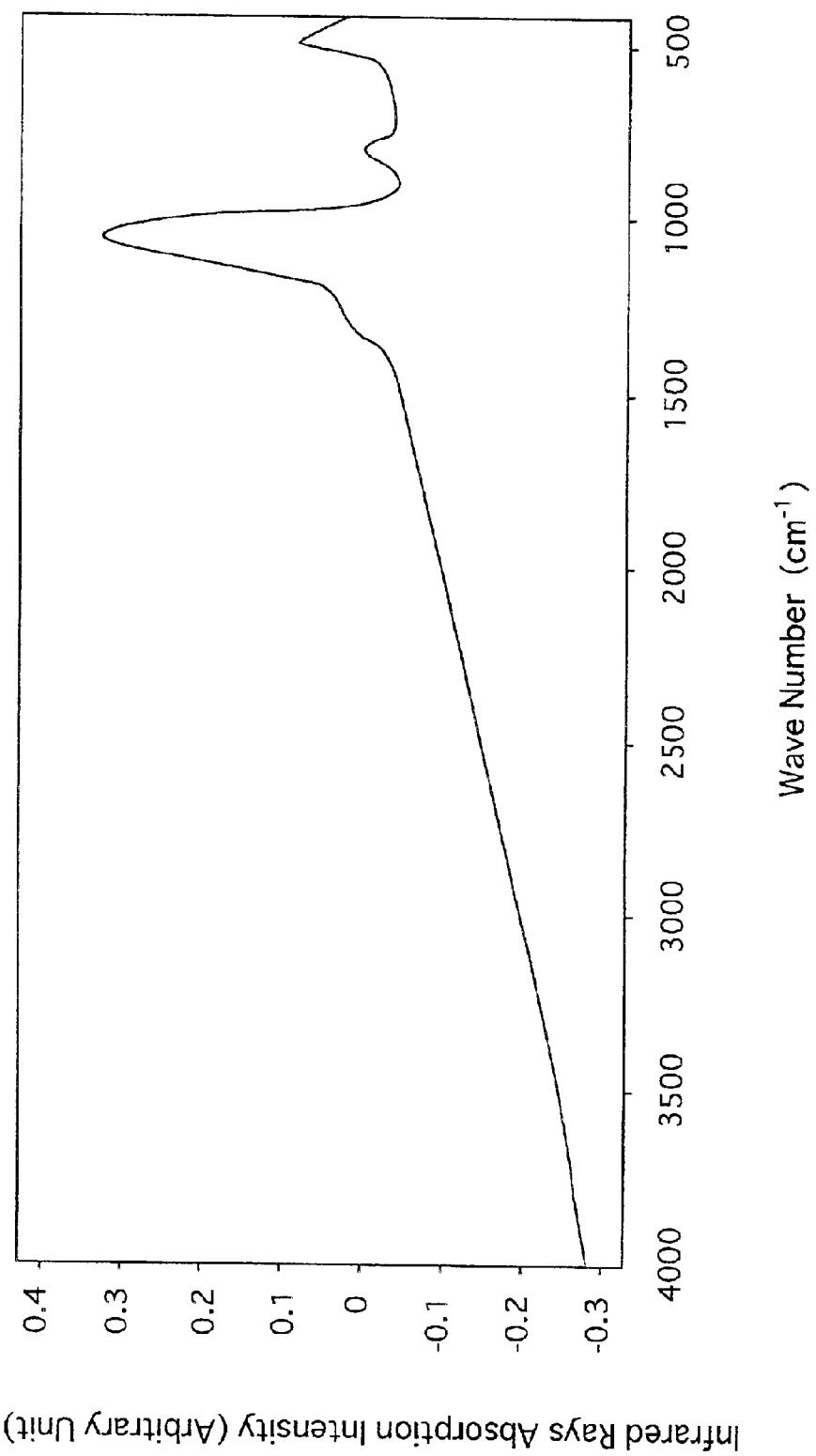
FIG. 5B is a graph of infrared absorption intensity of the silicon-containing insulating film that is formed by the film forming method according to the second embodiment of the present invention using the comparative sample of FIG. 2A.

Results for infrared ray absorption intensity in the sample S1 by the FT-IR analysis method (Fourier Transform Infrared analysis method) are shown in FIG. 5A. Similarly, results for comparative samples CS1, CS2 are shown in FIG. 5B.

The ordinate of FIG. 5A denotes the absorption intensity expressed on a linear scale (arbitrary unit), and the abscissa denotes the wave number expressed on a linear scale (cm$^{-1}$). This is similarly true of FIG. 5B.

As shown in FIG. 5A, the peak of the infrared ray absorption intensity, having a center wave number in a range of 2270 to 2350 cm$^{-1}$, is confirmed. In contrast, as shown in FIG. 5B, such a peak is not seen for comparative samples CS1, CS2.

(vi) Water Resistance

The water resistance of the PE-CVD TMS SiO$_2$ film 42b was examined by the high pressure humidifying test (pressure-cooker test) using the samples S2, S3 shown in FIG. 2B. By way of comparison, a similar examination was applied to the comparative sample CS3 employing the PE-CVD TEOS SiO$_2$ film 51b in place of the PE-CVD TMS SiO$_2$ film 42b and the comparative sample CS5 employing the PE-CVD SiN film 53.

The conditions of the high pressure humidifying test are given as follows. The time of exposure was used as a parameter.

Temperature: 121° C.

Pressure: 2.0 atm

Humidity: 100% R.T. (Room Temperature)

Evaluation of the water resistance was carried out by evaluating the amount of P=O bonds contained in the examined insulating film after the high pressure humidifying test. In order to evaluate the amount of P=O bonds contained in the BPSG film 43, the P=O absorption coefficient was measured by the FT-IR analysis method. If moisture enters into the BPSG film 43, the P=O bonds in the film react with the moisture and are thereby destroyed. In this case, if the PE-CVD TMS SiO$_2$ film 42b covering the BPSG film 43 has high water resistance, such film does not allow the moisture to pass through and thus the P=O bonds in the BPSG film 43 are not destroyed. As a result, it is possible to say that, as the time dependent change of the P=O absorption coefficient becomes smaller, the water resistance becomes higher.

FIG. 6 is a graph showing the time dependent change of the amount of phosphorus contained in the insulating film after the high pressure humidifying test is carried out. The ordinate denotes the P=O absorption coefficient (arbitrary unit) expressed on a linear scale, and the abscissa denotes the exposure time (H (hour)) expressed on a linear scale.

Based on the results shown in FIG. 6, it is found that, even after both the samples S2, S3 are left for 150 hours as they are, their P=O absorption coefficients are seldom changed from the initial P=O absorption coefficient, regardless of the magnitude of the thickness of the PE-CVD TMS $SiO_2$ film 42b, like the PE-CVD SiN film 53 in the comparative sample CS5, i.e., the PE-CVD TMS $SiO_2$ film 42b has water resistance equivalent to that of the PE-CVD SiN film 53.

Also, the water resistance was examined by another high pressure humidifying test applied to sample 83 and the comparative samples CS3 and CS4.

The conditions of the high pressure humidifying test were the same as above.

Figure 7:
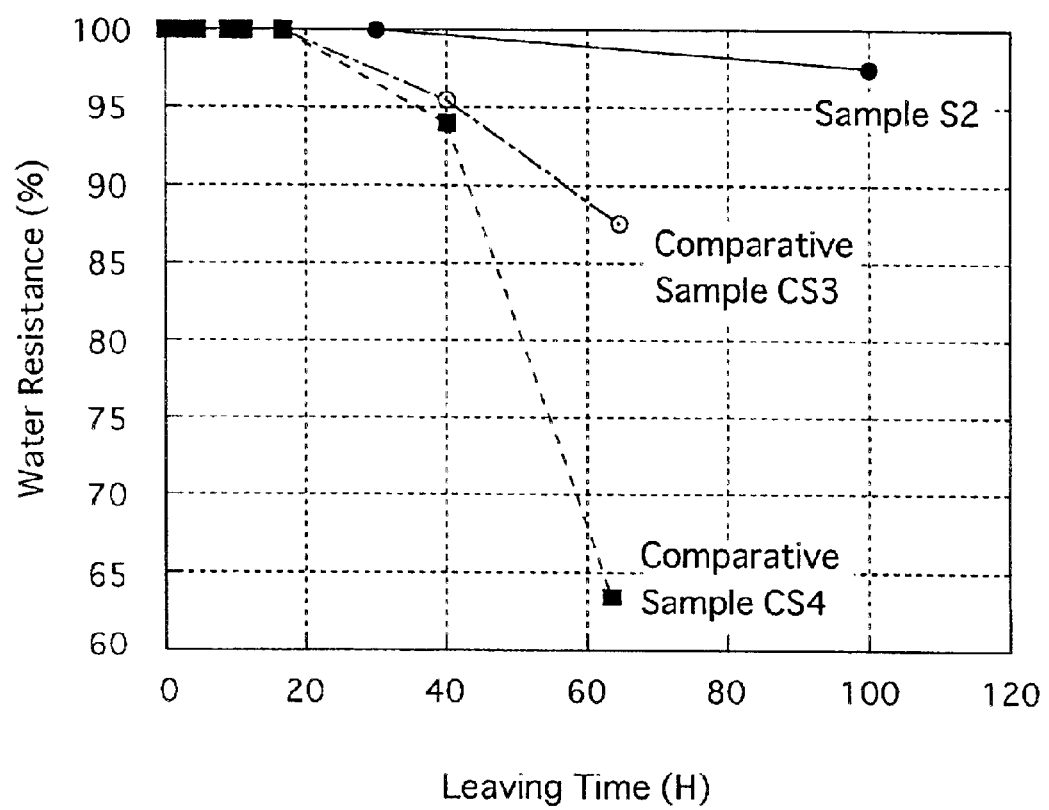
FIG. 7 is a graph of water resistance as determined by a pressure-cooker test of the silicon-containing insulating film that is formed by the film forming method according to the second embodiment of the present invention using the sample of FIG. 2B.

The results are shown in FIG. 7. The ordinate of FIG. 7 denotes the water resistance (%) expressed on a linear scale, and the abscissa denotes the exposure time (H(hour)) expressed on a linear scale.

In the manner described above, evaluation of the water resistance was carried out by determining the amount of P=O bonds contained in the examined insulating film after the high pressure humidifying test. The water resistance in FIG. 7 is derived by calculating the P=O absorption coefficient obtained after the high pressure humidifying test on the basis of the P=O absorption coefficient before taken as 100.

As shown in FIG. 7, it was found that the sample S3 had water resistance of 97.4% (100 H), a value exceeding that of the comparative samples CS3, CS4.

(vii) Leakage Current of the Film

A sample S1A was formed as shown in FIG. 2E. That is, the electrode 45 was formed on the PE-CVD TMS $SiO_2$ film 42 having a film thickness (t) of 200 nm, i.e., on the sample S1 according to the present invention.

The leakage current flowing through the silicon substrate 41 and the electrode 45 was measured by applying voltage between the silicon substrate 41 and the electrode 45. The silicon substrate 41 was grounded, and a negative voltage was applied to the electrode 45.

According to the results, the leakage current of the PE-CVD TMS $SiO_2$ film 42a was on the order of $10^{-8}$ A/cm² at an electric field strength of 5 MV/cm, and the breakdown voltage was about 10 MV/cm in terms of the electric field.

(viii) Adhesiveness of the Film

The adhesiveness between the PE-CVD TMS $SiO_2$ film 42c according to the present invention and the underlying low dielectric constant insulating film 44a, 44b was examined for samples S4, S5. Also, a sample which was subjected to the surface treatment prior to film formation and a sample which was not subjected to the surface treatment were prepared, and then examined in similar fashion. The surface treatment executed prior to the film formation was a reforming of the surface of the processed film employing a plasma of $N_2$, $NH_3$, $H_2$, etc.

By way of comparison, the PE-CVD TEOS $SiO_2$ film 51c was employed in place of the PE-CVD TMS $SiO_2$ film 42c, and similar examinations were carried out employing the inorganic coating insulating film 44a (the comparative sample CS6) and the organic coating insulating film 44b (the comparative sample CS7) as the low dielectric constant insulating film.

For examining the adhesiveness of the film, a peel test using the tape and a peel test by the CMP (Chemical Mechanical Polishing) over the entire surface of the wafer were carried out.

According to the results of examination, regardless of the use of the surface treatment prior to the film formation, the PE-CVD TMS $SiO_2$ film 42c showed good adhesiveness to the inorganic coating insulating film 44a and the organic coating insulating film 44b. In contrast, the degree of the adhesiveness of the PE-CVD TEOS $SiO_2$ film 51c was inferior to that of the PE-CVD TMS $SiO_2$ film 42c as a whole and the adhesiveness differed according to whether or not the surface treatment was applied prior to the film formation. That is, the sample which was subjected to the surface treatment prior to the film formation had higher adhesiveness than the sample which was not subjected to the surface treatment.

(ix) Defect Generating Rate Due to Heat Cycle

The defect generation due to the heat cycle for sample S6 and the comparative samples CS8, CS9 was examined. Respective samples were sealed in a package. Test conditions of the heat cycle were as follows. The cycle number is used as a parameter.

High temperature (holding time): 150° C. (20 minutes)
Low temperature (holding time): −55° C. (20 minutes)
Cycle number: 100, 200, 300, 500° C.

Figure 9:
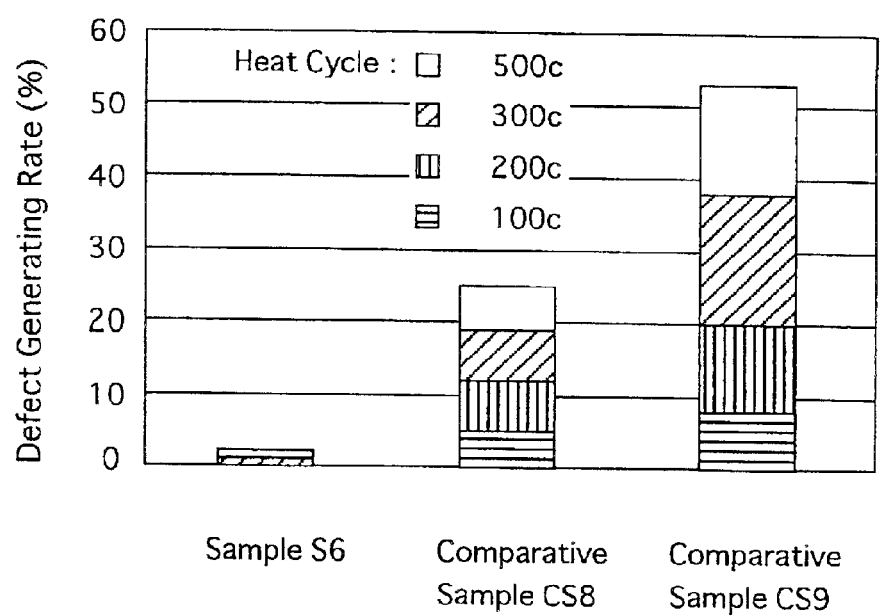
FIG. 9 is a graph of defect generating rate due to a heat cycle determined using the sample of FIG. 2D according to the second embodiment of the present invention.

The results are shown in FIG. 9. The ordinate in FIG. 9 denotes the defect generation rate (%) expressed on a linear scale, and the abscissa denotes the type of sample. The samples were S6, and the comparative samples CS8 and CS9, as explained above, in order from the left side. The partition area indicated by a bar graph denotes the fraction defective for a particular cycle, i.e., the partition area hatched by lateral lines denotes the fraction defective at 100° C., the partition area hatched by vertical lines denotes the fraction defective at 200° C., the partition area hatched by oblique lines denotes the fraction defective at 300° C., and the white partition area on a black background denotes the fraction defective at 500° C.

As shown in FIG. 9, in sample S6 employing a silicon oxide film of the present invention as both the upper protection layer and the lower protection layer, defects were generated at 300° C. or more, but the amount of defects generated was about 2 to 3% even if the defects generated at 300° C. and 500° C. are added. In the comparative sample CS8 employing the silicon oxide film 52d of the present invention only as the lower protection layer, defects were generated almost uniformly from 100° C. to 500° C., and the defects generated were about 25% in total. In the comparative sample CS9 not employing the silicon oxide film 42d, 42e of the present invention, both as an upper protection layer and as a lower protection layer, the defects were generated from 100° C. to 500° C. In particular, the defects generated at 300° C. and 500° C. increased, so that the defects generated totaled about 53%.

(x) Examination of the Cu Barrier Characteristic (a) TDDB (Time Dependent Dielectric Breakdown) Test The TDDB test measures the time required to come up to the dielectric breakdown when a voltage is applied to the sample.

The examined sample was prepared by stacking the PE-CVD TMS $SiO_2$ film according to the present invention and the Cu film on the Si substrate in sequence. For comparison, a sample employing the PE-CVD TEOS $SiO_2$ film in place of the PE-CVD TMS $SiO_2$ film, and a sample interposing the TiN film between the Cu film and the PE-CVD TEOS $SiO_2$ film were utilized.

The results showed a breakdown lifetime of $10 \times 10^5$ seconds obtained at an electric field strength of 8 MV/cm.

In contrast, in the sample employing the PE-CVD TEOS $SiO_2$ film, an electric field strength of 8 MV/cm resulted in a breakdown lifetime on the order of $10 \times 10^5$ seconds. This means that the breakdown lifetime of the sample employing the PE-CVD TMS $SiO_2$ film was longer by almost six figures than the sample employing the PE-CVD TEOS $SiO_2$ film.

In the sample interposing the TiN film between the Cu film and the PE-CVD TEOS SiO$_2$ film, an electric field strength of 7.5 MV/cm resulted in a breakdown lifetime on the order of 10×10$^5$ seconds.

With the above, it is possible to say that the sample employing the PE-CVD TMS SiO$_2$ film has a longer breakdown lifetime by almost six figures than that of the sample employing the PE-CVD TEOS SiO$_2$ film and serves as a barrier to Cu, equivalent to or exceeding that of the TiN film.

(b) Examination of Heat Resistance

Figure 10:
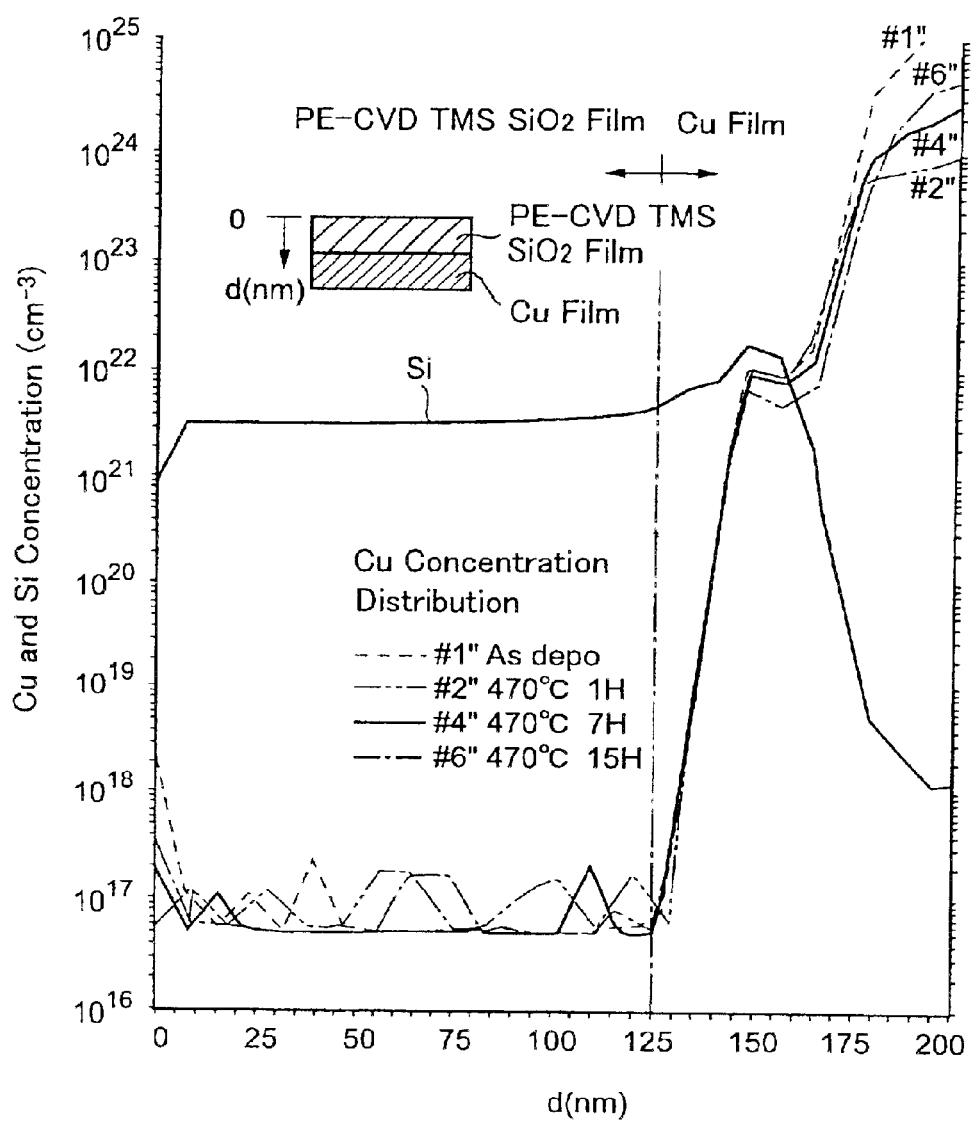
FIG. 10 is a graph of copper barrier characteristic of the silicon-containing insulating film that is formed by the film forming method according to the second embodiment of the present invention.

As shown in FIG. 10, a sample was prepared by stacking the PE-CVD TMS SiO$_2$ film of 125 run in thickness according to the present invention and the Cu film on the Si substrate (not shown) in contact with each other.

By measuring the distribution of the Cu concentration in the PE-CVD TMS SiO$_2$ film, obtained immediately after the film formation (indicated by a dotted line in FIG. 10), after the sample is processed for a predetermined time, i.e., 1 hour (chain double-dashed line), 7 hours (solid line), and 15 hours (dot-dash line)) at the temperature of 470° C.

FIG. 10 is a graph showing the results. In FIG. 10, the ordinate on the left side denotes Cu concentration and Si concentration (cm$^{-3}$) represented on a logarithmic scale. The abscissa denotes depth (nm) measured from one surface of the PE-CVD TMS SiO$_2$ film toward the Cu film side and is represented on a linear scale.

As shown in FIG. 10, the distribution seldom changes from that obtained immediately after the film formation. In other words, it is found that the PE-CVD TMS SiO$_2$ film is a sufficiently good barrier to Cu.

In the above, the alkoxy compound (e.g. TMS) having Si—H bonds is employed as the silicon-containing gas in the film forming gas. But an siloxane having Si—H bonds may be employed.

While N$_2$O is employed as the oxygen-containing gas in the above, any gas selected from the group consisting of oxygen (O$_2$), nitrogen dioxide (NO$_2$), carbon monoxide (CO), carbon dioxide (CO$_2$) and water (H$_2$O) may be employed.

In addition, if hydrogen (H$_2$) or nitrogen (N$_2$) is added to the above film forming gas, the density can be further enhanced.

Third Embodiment

Next, a semiconductor device and a method of manufacturing the same according to a third embodiment of the present invention will be explained with reference to FIGS. 11A and 11B hereunder.

Figure 11A:
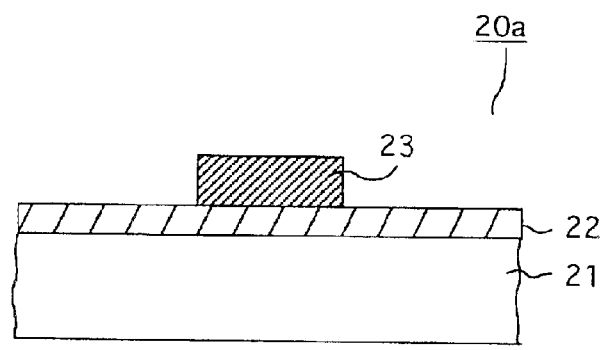
FIGS. 11A and 11B are sectional views showing a semiconductor device manufacturing method according to a third embodiment of the present invention.
Figure 11B:
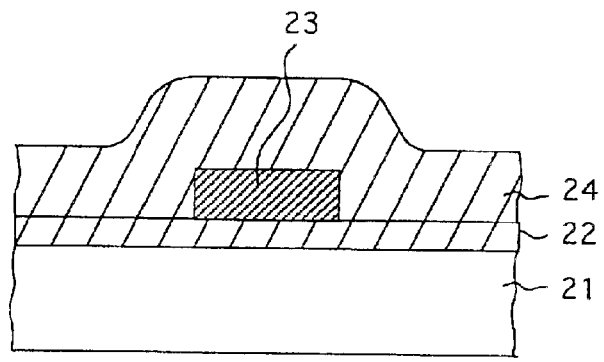

As shown in FIG. 11B, a silicon oxide film (the silicon-containing insulating film) 24 according to the present invention is formed on the substrate 20a The substrate 20a consists of the underlying insulating film 22 and the wiring 23, both formed on the base substrate 21. The silicon oxide film 24 covers the wiring 23. In the silicon oxide film 24 according to the present invention, the peak infrared ray absorption intensity was in a wave number range of 2270 to 2350 cm$^{-1}$, film density was in a range of 2.25 to 2.40 g/cm$^3$, and relative dielectric constant was in a range of 3.3 to 4.3.

In this case, the silicon substrate or the base substrate obtained by forming the wiring and the insulating film on the silicon substrate may be employed as the base substrate 21. A conductive material such as aluminum, copper, etc., may be employed as the material of the wiring 23.

Thus, the silicon oxide film 24 according to the present invention may be employed as the insulating film that covers the wiring 23.

In a third embodiment, the silicon-containing insulating film 24 according to the present invention is formed in contact with and covering the wiring 23.

The above-described silicon-containing insulating film 24 is dense, has excellent water resistance, and contains only a small amount of moisture, which are qualities equivalent to those of a silicon nitride film, and also has a smaller relative dielectric constant than that of a silicon nitride film. As a result, if the silicon-containing insulating film according to the present invention is employed as the protection layer 24 covering the wiring 23, etc., corrosion of the wiring 23 can be prevented by preventing moisture permeation, while reducing the parasitic capacitance between the wires of wiring 23.

FIGS. 11A and 11B are sectional views illustrating steps in the method for manufacturing the semiconductor device according to the third embodiment of the present invention. TMS+N$_2$O is employed as the film forming gas for the PE-CVD TMS SiO$_2$ film according to the present invention.

First, as shown in FIG. 11A, an underlying insulating PE-CVD TMS SiO$_2$ film 22 is formed on the silicon substrate 21 by the plasma CVD method using TMS+N$_2$O as the film forming gas.

In order to form the PE-CVD TMS SiO$_2$ film, first the silicon substrate 21 is loaded into the chamber 1 of the plasma film forming apparatus 101 and held by the substrate holder 3. Then, the silicon substrate 21 is heated to maintain a temperature of 350° C. TMS and the N$_2$O gas are introduced into the chamber 1 of the plasma film forming apparatus 101 shown in FIG. 1 at flow rates of 100 sccm and 3000 sccm, respectively, to hold the pressure at 0.7 Torr. Then, power of 0.3 W/cm$^2$ at a frequency of 380 kHz is applied to the lower electrode 3 and also a power of 0.3 W/cm$^2$ at a frequency of 13.56 MHz is applied to the upper electrode 2, thereby converting the TMS and N$_2$O into a plasma. A PE-CVD TMS SiO$_2$ film 22 of about 200 nm in thickness was formed while holding this condition for a predetermined time. The thus formed PE-CVD TMS SiO$_2$ film 22 was found to have a relative dielectric constant of about 3.9 as measured at a frequency of 1 MHz, and a leakage current of 10$^{-8}$ A/cm$^2$ at an electric field strength of 5 MV/cm.

Wiring (lower wiring) 23 was then formed on the underlying insulating film 22. Then, as shown in FIG. 11B, a PE-CVD TMS SiO$_2$ film 24 of about 500 nm in thickness was formed by the same plasma CVD method used to form the above-described PE-CVD TMS SiO$_2$ film 22.

As described above, according to the third embodiment of the present invention, the underlying insulating film 22 is formed on the silicon substrate 21 before the wiring 23 is formed. The PE-CVD TMS SiO$_2$ film is dense, has good water resistance, and has a low amount of moisture contained in the film. Therefore, the underlying insulating film 22 can prevent moisture from reaching the silicon substrate 21.

Also, since the leakage current between the wiring 23 and the silicon substrate 21 is suppressed, the transistors, the capacitors of the memory elements, etc., formed on the silicon substrate 21, are covered with the PE-CVD TMS SiO$_2$ film. Therefore, leakage of the accumulated charge can be prevented and thus the reliability of the device can be improved.

In addition, since the PE-CVD TMS SiO$_2$ film 24 is formed after the wiring 23 is covered, corrosion of the wiring 23 due to moisture in the film 24 and ambient moisture can be prevented.

Further, since the PE-CVD TMS SiO$_2$ film 24 has a lower relative dielectric constant than that of the silicon nitride film and a small leakage current, the leakage current between the wires of the wiring is suppressed and the parasitic capacitance between the wires can be reduced both for adjacent wires and for multi-layered wiring.

Fourth Embodiment

Next, a semiconductor device and a method of manufacturing the same according to a fourth embodiment of the present invention will be explained with reference to FIGS. 12A to 12C.

Figure 12A:
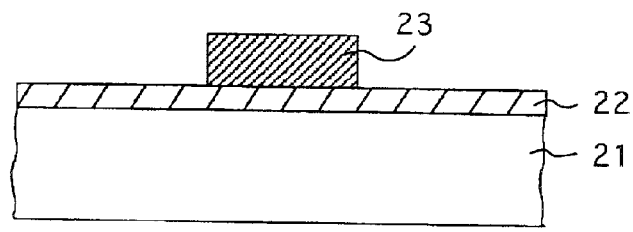
FIGS. 12A to 12C are sectional views showing a semiconductor device manufacturing method according to a fourth embodiment of the present invention.
Figure 12B:
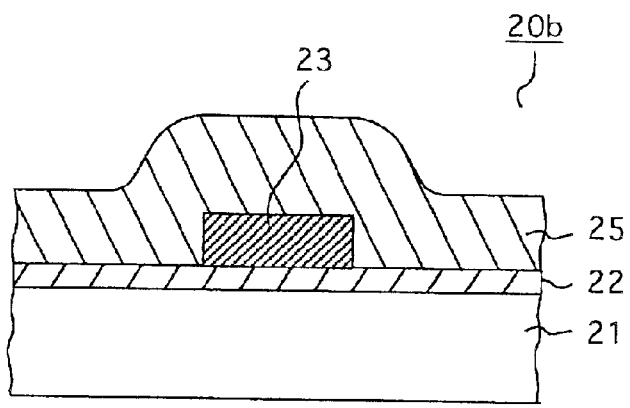
Figure 12C:
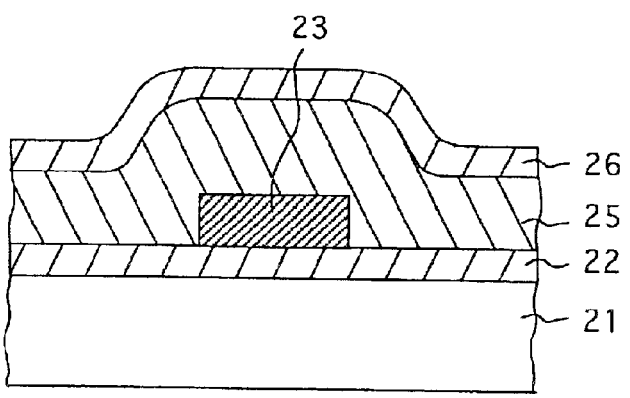

As shown in FIG. 12C, a low dielectric constant insulating film 25 such as a porous insulating film, a SiOF film, or the like is formed to cover the wiring 23, and then the protection layer 26 made of the silicon oxide film (silicon-containing insulating film) of the present invention is formed on the insulating film 25.

In the silicon oxide film 26 of the present invention, the peak of the infrared ray absorption intensity is in a wave number range of 2270 to 2350 $cm^{-1}$, the film density is in the range of 2.25 to 2.40 $g/cm^3$, and the relative dielectric constant is in the range of 3.3 to 4.3.

Thus, the silicon oxide film 26 has qualities which are equivalent to those of a silicon nitride film. The silicon oxide film 26 has a low relative dielectric constant, is dense, has excellent water resistance, and has a low moisture content. Accordingly, if the silicon-containing insulating film according to the present invention is employed as the protection layer 26 that covers the wiring 23, etc., corrosion of the wiring 23 can be prevented by preventing the permeation of moisture, while reducing the parasitic capacitance between the wires of wiring 23.

In particular, if a porous insulating film having high hygroscopicity is employed as the insulating film 25 that covers the wiring 23, ingress of moisture into the porous insulating film can be prevented and also the increase in the dielectric constant due to moisture absorption can be prevented.

FIGS. 12A to 12C are sectional views showing the method of manufacturing the same according to the fourth embodiment of the present invention. $TMS+N_2O$ is used as the film forming gas.

First, as shown in FIG. 12A, like the third embodiment, a underlying insulating film 22 made of the PE-CVD TMS $SiO_2$ film is formed on the silicon substrate (base substrate) 21 by the plasma CVD method using $TMS+N_2O$ as the film forming gas. The thus formed PE-CVD TMS $SiO_2$ film 22 had a relative dielectric constant of about 3.9 measured at a frequency of 1 MHz, and had a leakage current of $10^{-8}$ $A/cm^2$ in an electric field strength of 5 MV/cm.

Then, the wiring (lower wiring) 23 is formed on the underlying insulating film 22. Next, as shown in FIG. 12B, a porous insulating film 25 having a low dielectric constant and a film thickness of about 500 nm is formed by the conventional method to complete substrate 20b.

Then, as shown in FIG. 12C, a protection film 26, i.e., a PE-CVD TMS $SiO_2$ film having a film thickness of about 200 nm, is formed by the plasma CVD method that is used to form the above PE-CVD TMS $SiO_2$ film 22.

As described above, according to the fourth embodiment, the protection film 26 (PE-CVD TMS $SiO_2$ film) is formed on the porous insulating film 25 that covers the wiring 23. The PE-CVD TMS $SiO_2$ film is dense, has good water resistance, and the amount of moisture contained in the film is low.

Therefore, the protection film 26 can prevent ambient moisture from reaching the wiring 23. Also, the leakage current of the overall interlayer insulating film, including the porous insulating film 25, can be reduced.

Fifth Embodiment

Next, a semiconductor device and a method of manufacturing the same according to a fifth embodiment of the present invention will be explained with reference to FIGS. 13A to 13F. In this fifth embodiment, as in the third embodiment, $TMS+N_2O$ is used as the film forming gas.

Figure 13A:
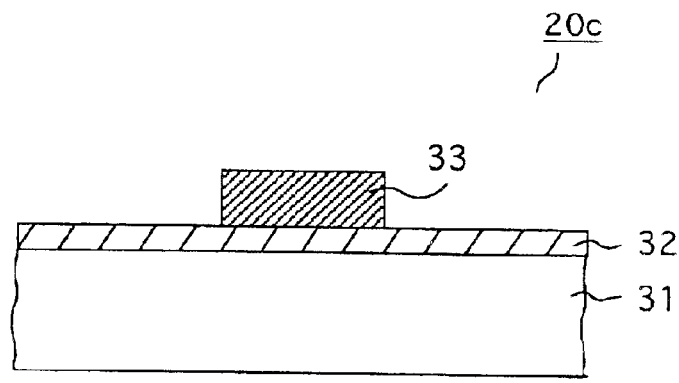
FIGS. 13A to 13F are sectional views showing a semiconductor device manufacturing method according to a fifth embodiment of the present invention.
Figure 13B:
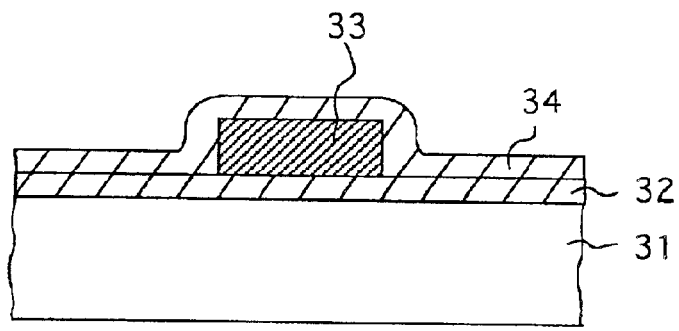
Figure 13C:
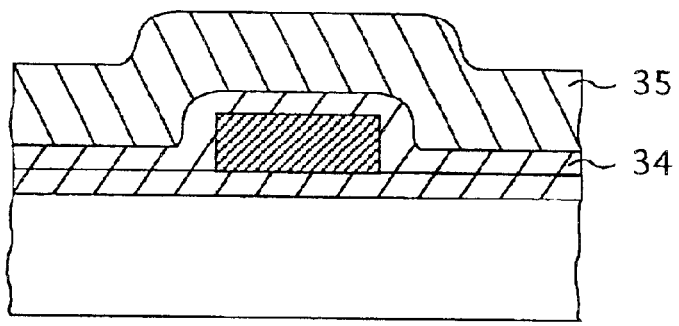
Figure 13D:
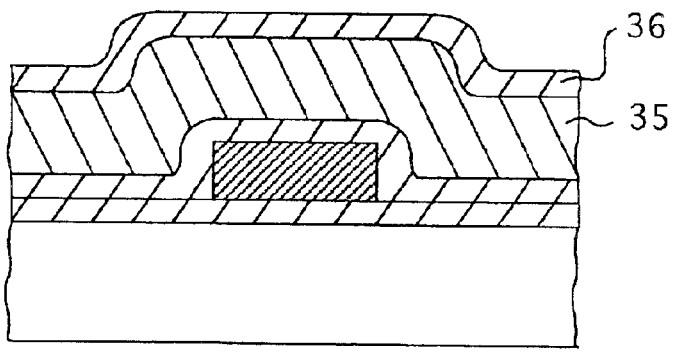
Figure 13E:
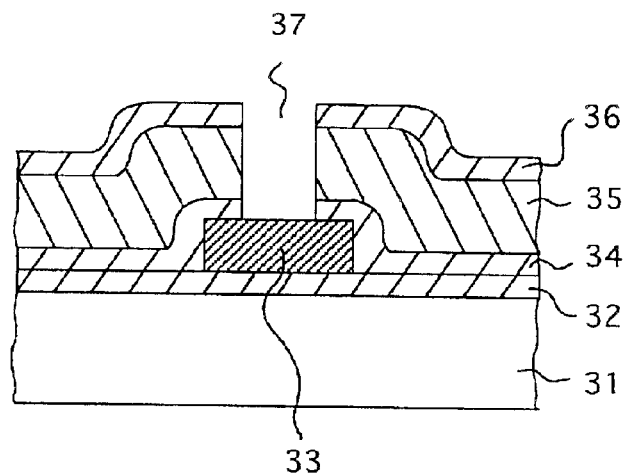
Figure 13F:
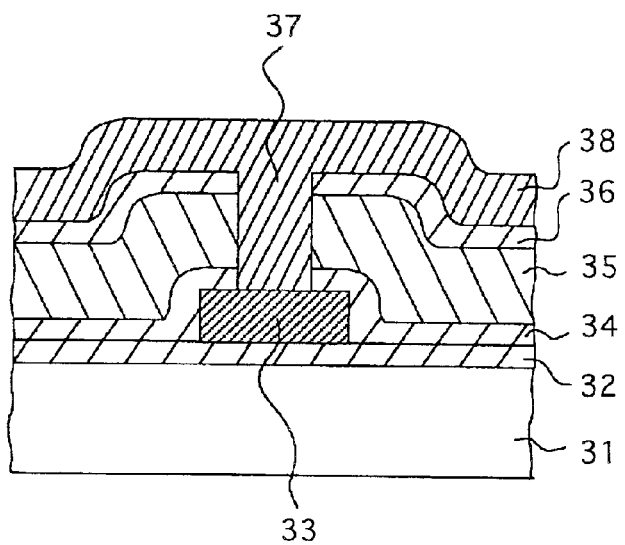

As shown in FIG. 13F, in the semiconductor device, an underlying insulating film 32 is formed on a base substrate 31, and lower wiring 33 is formed thereon. Further, an interlayer insulating film is formed in contact with and covering the lower wiring 33. The same base substrate 21 as shown in FIG. 11B may be employed as the base substrate 31.

The interlayer insulating film is formed by laminating a lower protection layer 34, formed of the silicon-containing insulating film according to the present invention, a main insulating film 35, and an upper protection layer 36, formed of the silicon-containing insulating film according to the present invention, in sequence from the lower layer. In the silicon-containing insulating film according to the present invention, the peak of the infrared absorption intensity is in a wave number range of 2270 to 2350 $cm^{-1}$, film density is in a range of 2.25 to 2.40 $g/cm^3$, and relative dielectric constant is in a range of 3.3 to 4.3.

In this embodiment, the porous insulating film or the SiOF film, that is the insulating film having a low dielectric constant, may be employed as the main insulating film 35.

A via hole 37 is formed in the interlayer insulating film covering the lower wiring 33, and the lower wiring 33 and the upper wiring 38 are connected through this via hole 37.

As described above, according to this fifth embodiment, since the lower protection layer 34 made of the PE-CVD TMS $SiO_2$ film covers the lower wiring 33, the corrosion of the lower wiring 33 due to the moisture contained in the lower protection layer 34 and the ambient moisture can be prevented.

Further, the upper and lower protection layers 34, 36 made of the PE-CVD TMS $SiO_2$ film sandwich the main insulating film 35 therebetween.

If the main insulating film 35 is formed of SIOF, the diffusion of elemental fluorine (F) into the outer peripheral portions of the upper and lower protection layers 34, 36 can be prevented.

In contrast, if the main insulating film 35 is a porous insulating film, hygroscopicity is high and the dielectric constant readily varies due to the moisture absorption. However, if the main insulating film 35 is sandwiched between the upper and lower protection layers 34, 36, the permeation of ambient moisture into the main insulating film 35 can be reduced and thus the dielectric constant of the interlayer insulating film is stabilized at a low value. Also, the leakage current of the overall interlayer insulating film containing the porous insulating film 35 can be suppressed.

Because the PE-CVD TMS $SiO_2$ films 34, 36 have a low relative dielectric constant and low leakage current, in the case of a plurality of wirings closely arranged or multi-layered wiring, the leakage current between the wirings can be suppressed and also the parasitic capacitance between the wirings can be reduced.

If the underlying insulating film 32 formed on the base substrate 31 is a PE-CVD TMS $SiO_2$ film according to the present invention, the permeation of moisture into the underlying insulating film 32 and to the base substrate 31 can be prevented. If the silicon is employed as the base substrate 31, the leakage current between the lower wiring 33 and the base substrate 31 is reduced. The transistors, capacitors of the memory devices, etc. formed on the silicon substrate, are covered with the PE-CVD TMS $SiO_2$ film and, as a result, leakage of the accumulated charges can be prevented and thus the reliability of the device can be improved.

FIGS. 13A to 13F are sectional views illustrating steps in the method of manufacturing the semiconductor device according to the fifth embodiment of the present invention. In this fifth embodiment, as in the third embodiment, TMS+ $N_2O$ is used as the film forming gas.

FIG. 13A is a sectional view showing the state after the wiring is formed. In FIG. 13A, 31 denotes a silicon substrate (base substrate); 32, an underlying insulating film; and 33, a wiring (lower wiring). If the wiring 33 is copper, a TaN film serving as a copper barrier for the underlying insulating film 22 and a Cu film formed by sputtering, although not shown, are formed between the underlying insulating film 32 and the wiring (lower wiring) 33. These films constitute the substrate 20c.

In this state, as shown in FIG. 13B, a barrier insulating film (lower protection layer) 34 of PE-CVD TMS $SiO_2$ having a thickness of about 50 nm is formed on the wiring 33 by the plasma CVD method using TMS+$N_2O$.

The barrier insulating film 34 is formed by the same manufacturing method as the underlying insulating film 22 in the third embodiment. Because the same film forming conditions are employed, their explanation will be omitted herein. The formed barrier insulating film 34 was found to have a relative dielectric constant of about 3.9 measured at a frequency of 1 MHz, and a leakage current of $10^{-8}$ $A/cm^2$ in an electric field strength of 5 MV/cm.

Then, as shown in FIG. 13C, a porous insulating film 35 having a low dielectric constant and a film thickness of about 500 nm is formed by a conventional plasma CVD method. The porous insulating film may be formed as a multi-layered insulating film by repeating the film formation by the low pressure thermal CVD method and the film formation by the plasma CVD method, by laminating the organic film and the $SiO_2$ film alternatively and then removing the organic film using an oxygen plasma, etc.

Next, as shown in FIG. 13D, a thin and highly dense NSG film (silicon oxide film not containing impurity), that serves as a protection film (upper protection layer) 36 for the porous insulating film 35 in ashing and etching, is formed. If no protection film 36 is formed, the quality of the porous insulating film 35 is altered by the process gas when ashing the photoresist film or when the barrier insulating film 34 under the porous silicon-containing insulating film 35 is etched, and thus there is the possibility that the low dielectric constant characteristic is lost. The protection film 36 may be omitted.

Then, as shown in FIG. 13E, a photoresist film (not shown) is formed with an opening in the via-hole forming area by patterning the photoresist film. Then, the protection film 36 is etched and removed through the opening in the photoresist film by reactive ion etching (RIE) using a plasma of $CF_4+CHF_3$. Then, the porous insulating film 35 is etched and removed using a mixed gas containing $CF_4+CHF_3$ in a ratio different than that of the gas used in the etching of the protection film 36. Accordingly, an opening is formed to expose the barrier insulating film 34. The photoresist film is then removed by ashing. The barrier insulating film 34 has resistance against the etching gas for the porous insulating film 35 and the ashing gas for the photoresist film. As a result, the wiring 33 is not adversely affected by the etching gas, etc. The concentration of the mixed gas containing $CF_4+CHF_3$ maybe adjusted by adding $Ar+O_2$, etc.

Then, the barrier insulating film 34 is etched and removed via the opening in the protection film 36 and the opening in the porous insulating film 35 by reactive ion etching (RE) using a plasma of a mixed gas containing $CF_4+CHF_3$, that has the same composition as the gas used in the etching of the above protection film 36. Accordingly, a via hole is formed to expose the barrier insulating film 34. The lower wiring 33 is protected from the etching gas for the above barrier insulating film 34 and, as a result, the lower wiring 33 is not badly affected by the etching gas. In this case, the surface of the lower wiring 33 is oxidized. But such oxide film may be removed by exposing to a hydrogen plasma diluted with a reducing gas, e.g., an inert gas such as $NH_3$, argon, nitrogen, or the like after the ashing of the photoresist film and the etching of the barrier film are completed.

As shown in FIG. 13F, a conductor is then filled in the via hole 37. Next, upper wiring 38 made of copper or aluminum is formed and connected to the 15 lower wiring 33 through the via hole 37. If the upper wiring 38 is copper, an underlying conductive film consisting of a barrier metal film, e.g., such as a tantalum nitride (TaN), is provided and a copper film formed by sputtering is provided in the via hole 37, and then the conductive film is formed thereon.

With the above, the formation of the upper wiring 38 is completed. The upper wiring 38 is connected to the lower wiring 33 through the via holes in the protection film 36, the porous insulating film 35, and the barrier insulating film 34.

As described above, according to the fifth embodiment, the lower wiring 33 is covered with the barrier insulating film 34, i.e., the PE-CVD TMS $SiO_2$ film of the present invention.

The results obtained in the second embodiment show that the PE-CVD TMS $SiO_2$ film according to the present invention has qualities equivalent to those of a silicon nitride film. The PE-CVD TMS $SiO_2$ is dense, has excellent water resistance, and has a low moisture content. Accordingly, corrosion of the lower wiring 33 can be prevented by preventing the permeation of moisture.

In addition, if the underlying insulating film 32 is formed of the PE-CVD TMS $SiO_2$ film according to the present invention, all peripheral portions of the lower wiring 33 can be protected by the PE-CVD TMS $SiO_2$ film. Therefore, corrosion of the lower wiring 33 is further prevented by prevention of permeation of moisture from the peripheral portions of the lower wiring 33.

Further, upper and lower surfaces of the porous insulating film 35 having the low dielectric constant are protected by the barrier insulating film 34 formed of the PE-CVD TMS $SiO_2$ film and the protection film 36 formed of the PE-CVD TMS $SiO_2$ film. Accordingly, permeation of moisture into the porous insulating film 35 can be prevented. Therefore, variation in the relative dielectric constant due to moisture contained in the porous insulating film 35 is suppressed.

Furthermore, if moisture is contained in the porous insulating film 35 as formed, the out-flow of such moisture at the periphery can be prevented and thus corrosion of the lower wiring 33, etc. can be prevented.

The PE-CVD TMS $SiO_2$ film has a density that is equivalent to that of a silicon nitride film, but has a smaller relative dielectric constant. Accordingly, if the PE-CVD TMS $SiO_2$ film is employed as the interlayer insulating film, the smaller relative dielectric constant can be maintained. In particular, if the PE-CVD TMS $SiO_2$ film is employed as the barrier insulating film and the protection film that respectively protect the upper and lower surfaces of the porous insulating film 35, the smaller relative dielectric constant can be maintained for the whole interlayer insulating film made up of all of them.

In the above fifth embodiment the underlying insulating film 32 may be a thermal oxide film formed by heating in an oxygen-containing atmosphere to oxidize the silicon substrate 31, an NSG film formed by the CVD method using an organic silicon-containing gas, a BPSG film (BoroPhosphoSilicate Glass), etc. But the PE-CVD TMS $SiO_2$ film which is formed by the plasma CVD method according to the present invention may also be employed.

Sixth Embodiment

Figure 14A:
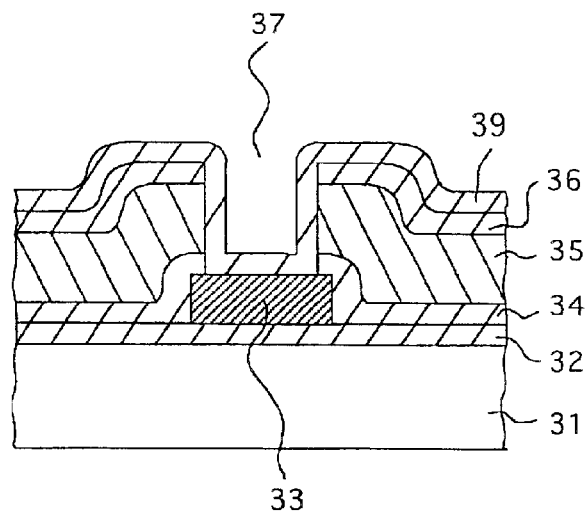
FIGS. 14A to 14C are sectional views showing a semiconductor device manufacturing method according to a sixth embodiment of the present invention.
Figure 14B:
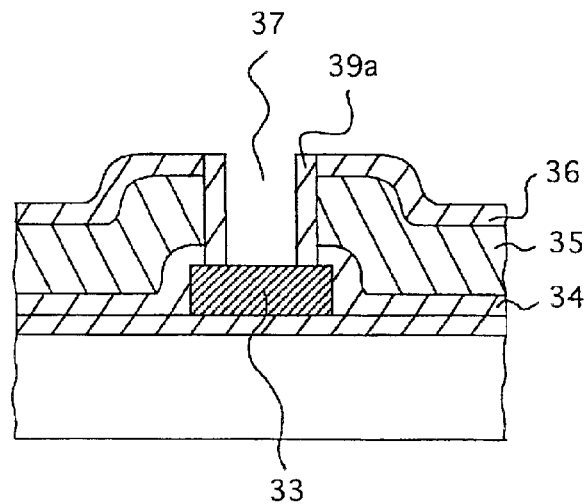
Figure 14C:
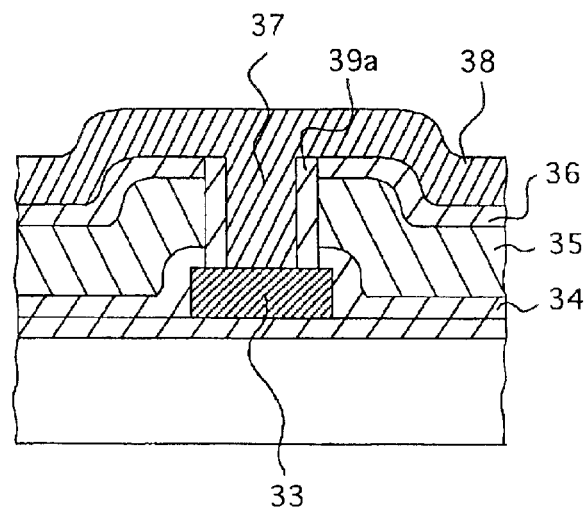

FIGS. 14A to 14C are sectional views showing a semiconductor device and a method of manufacturing the same according to a sixth embodiment of the present invention.

The semiconductor device of this sixth embodiment differs from that of the fifth embodiment in that a side wall of the via hole 37 is covered with a PE-CVD TMS $SiO_2$ film 39a of the present invention and thus the porous insulating film 35 is not exposed from the inner surface of the via hole 37.

In this manner, if a sidewall protection layer 39a of the PE-CVD TMS $SiO_2$ film is added to the structure shown in FIG. 13F, the porous insulating film 35 can be shielded almost completely from the ambient atmosphere by the PE-CVD TMS $SiO_2$ film according to the present invention. Therefore, the advantage with regard to protection from moisture explained in connection with the fifth embodiment is further enhanced.

In order to form the above structure, as shown in FIG. 14A, the PE-CVD TMS $SiO_2$ film 39 to which the present invention is applied is formed on the protection film 36 so as to cover the via hole 37, after the step shown in FIG. 13E. Then, as shown in FIG. 14B, the PE-CVD TMS $SiO_2$ film 39 is etched by anisotropic etching to leave the PE-CVD TMS $SiO_2$ film 39a on the sidewall of the via hole 37. Then, as shown in FIG. 14C, the upper wiring 38 made of copper or aluminum is formed and connected to the lower wiring 33 via the conductive film.

While the present invention is explained above in detail with reference to various embodiments, the scope of the present invention is not limited to the examples of the above embodiments. Variations in the above embodiments may be made within the scope of the present invention without departing from the gist thereof.

Other Embodiments

Figure 15:
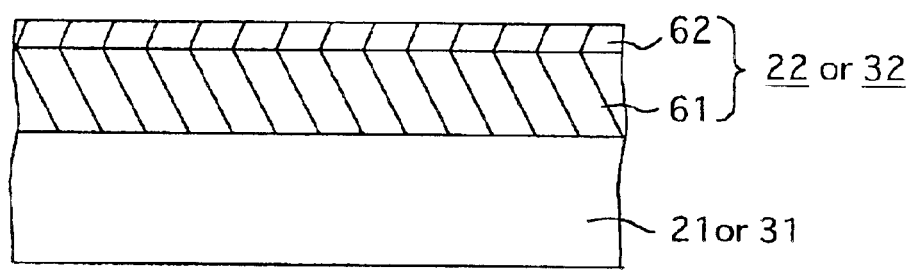
FIG. 15 is a sectional view showing a semiconductor device manufacturing method according to another embodiment of the present invention.

For example, as shown in FIG. 15, the underlying insulating film 22 or 32 is formed only of the PE-CVD TMS $SiO_2$ film and is formed directly on the silicon substrate 21 or 31; however, an underlying insulating film 22 or 32 having a multi-layered structure consisting of double layers, formed by laminating the BPSG film or the thermal oxide film 61 and the PE-CVD TMS $SiO_2$ film 62 in sequence from the bottom, may be utilized. In this case, it is important to arrange the PE-CVD TMS $SiO_2$ film as the uppermost layer.

Figure 16:
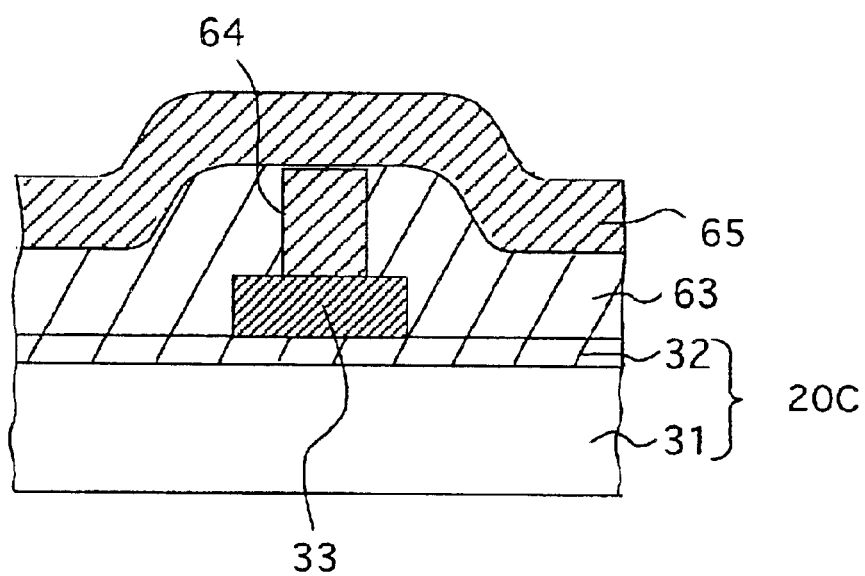
FIG. 16 is a sectional view showing a semiconductor device manufacturing method according to the other embodiment of the present invention.

Further, as shown in FIG. 16, a single interlayer insulating film 63 is interposed between the lower wiring 33 and the upper wiring 65 formed on the substrate 20c. In this case, the interlayer insulating film 63 is made of the silicon-containing insulation film. Moreover, the lower wiring 33 and the upper wiring 65 may be connected via an opening 64 penetrating the interlayer insulating film 63.

As described above, according to the present invention, the silicon-containing insulating film is formed on the substrate. In the silicon-containing insulating film according to the present invention, the peak infrared absorption intensity is in a wave number range of 2270 to 2350 $cm^{-1}$, the film density is in a range of 2.25 to 2.40 $g/cm^3$, and the relative dielectric constant is in a range of 3.3 to 4.3.

The silicon-containing insulating film is formed by converting into a plasma, a film forming gas that contains a gas selected from the group consisting of alkoxy compounds having Si—H bonds and siloxanes having Si—H bonds and an oxygen-containing gas selected from the group consisting of oxygen ($O_2$), nitrogen monoxide ($N_2O$), nitrogen dioxide ($NO_2$), carbon monoxide (CO), carbon dioxide ($CO_2$), and water ($H_2O$).

It has been experimentally shown that the silicon-containing insulating film in the above range for peak of infrared absorption intensity and in the above range for film density is dense, has a small relative dielectric constant, and has a low amount of moisture contained in the film Therefore, if the above silicon-containing insulating film is employed as the insulating film covering wiring or as the barrier insulating film sandwiching the low dielectric constant insulating film that constitutes the interlayer insulating film interposed between the upper wiring and the lower wiring, the dielectric constant of the insulating film covering the wiring or that of the overall interlayer insulating film can be lowered while preventing corrosion of the wiring and preventing increase in the leakage current.

What is claimed is:

1. A film forming method for forming a silicon-containing barrier insulating film on a substrate comprising the steps of:

(a) preparing a film-forming gas comprising, (1) at least one member selected from the group consisting of siloxane compounds having Si—H bonds and (2) at least one oxygen-containing gas selected from the group consisting of $O_2$, $N_2O$, $NO_2$, CO, $CO_2$, and $H_2O$;

(b) converting the film-forming gas into a plasma;

(c) contacting the substrate with the plasma to form the silicon-containing barrier insulating film on the substrate; and (d) forming a porous insulating film by plasma enhanced CVD or forming a SiOF film, as an interlayer insulating film, directly on said barrier insulating film.

2. A film forming method according to claim 1, wherein at least one member selected from a group consisting of $N_2$ and $H_2$ is added to the film-forming gas.

3. A film forming method according to claim 1, wherein (1) is tetramethyldisiloxane (TMDSO:$(CH_3)_2$HSi—O—SiH$(CH_3)_2$).

4. A film forming method according to claim 1, wherein parallel-plate type electrodes are employed as a plasma generating means, and wherein high frequency power having a frequency of 100 kHz to 1 MHz is applied to an electrode on which the substrate is loaded and high frequency power having a frequency of 1 MHz or more is applied to an electrode opposing the electrode on which the substrate is loaded.

5. A semiconductor device manufacturing method according to claim 1, wherein said interlayer insulating film has a greater thickness than the barrier insulating layer.

6. A film-forming method according to claim 1 wherein (1) is TMS and (2) is $N_2O$ and wherein the volumetric ratio of $N_2O$/TMS is about 30:1.

7. A semiconductor device manufacturing method comprising:

forming wiring on a surface of a substrate;

preparing a film-forming gas comprising, (1) at least one member selected from the group consisting of siloxane compounds having Si—H bonds and (2) at least one oxygen-containing gas selected from the group consisting of $O_2$, $N_2O$, $NO_2$, CO, $CO_2$, and $H_2O$;

converting the film-forming gas to a plasma;

contacting the surface of the substrate with the plasma to form a silicon-containing barrier insulating film directly on the wiring substrate; and forming a porous insulating film by plasma enhanced CVD or forming a SiOF film, as an interlayer insulating film, directly on said barrier insulating film.

* * * * *